US010224900B2

(12) United States Patent
Poole et al.

(10) Patent No.: US 10,224,900 B2
(45) Date of Patent: Mar. 5, 2019

(54) SYSTEMS AND METHODS FOR DE-NOISING SEISMIC DATA

(71) Applicant: CGG SERVICES SA, Massy (FR)

(72) Inventors: Gordon Poole, East Grinstead (GB); Richard Winnett, Faversham (GB)

(73) Assignee: CGG SERVICE SAS, Massy (FR)

( * ) Notice: Subject to any disclaimer, the term of this patent is extended or adjusted under 35 U.S.C. 154(b) by 547 days.

(21) Appl. No.: 14/429,555

(22) PCT Filed: Jun. 6, 2014

(86) PCT No.: PCT/EP2014/061922

§ 371 (c)(1), (2) Date: Mar. 19, 2015

(87) PCT Pub. No.: WO2014/195508

PCT Pub. Date: Dec. 11, 2014

(65) Prior Publication Data

US 2015/0236668 A1 Aug. 20, 2015

Related U.S. Application Data

(60) Provisional application No. 61/833,047, filed on Jun. 10, 2013, provisional application No. 61/832,419, filed on Jun. 7, 2013.

(51) Int. Cl.
*G06G 7/48* (2006.01)
*H03H 17/02* (2006.01)
(Continued)

(52) U.S. Cl.
CPC ......... *H03H 17/0248* (2013.01); *G01V 1/364* (2013.01); *G01V 99/005* (2013.01);
(Continued)

(58) Field of Classification Search
None
See application file for complete search history.

(56) References Cited

U.S. PATENT DOCUMENTS 9,405,028 B2 * 8/2016 Bloor ........................ G01V 1/38
9,442,209 B2 * 9/2016 Sollner .................. G01V 1/364
(Continued)

FOREIGN PATENT DOCUMENTS

EP 1217390 A1 6/2002
EP 2587279 A2 5/2013
GB 2448831 A 10/2008

OTHER PUBLICATIONS

Han, Li, David Bonar, and Mauricio Sacchi. "Seismic denoising by time-frequency reassignment." CSEG Annual Meeting Abstract (Calgary,). 2012.*

(Continued)

*Primary Examiner* — Aniss Chad
*Assistant Examiner* — Nithya J. Moll
(74) *Attorney, Agent, or Firm* — Patent Portfolio Builders PLLC

(57) ABSTRACT

Systems and methods are provided for de-noising seismic data recorded by seismic receivers. A first portion of the seismic data having a first signal-to-noise ratio (SNR) to is processed to generate a de-noising operator or function. The de-noising operator is applied to a second portion of seismic data having a second SNR to remove noise from the second portion of the seismic data, where the first SNR is greater than the second SNR.

25 Claims, 22 Drawing Sheets

100 102 104 106a 106b 106c 106d 108 110 112 114 116 118 R

(51) Int. Cl.
*G01V 1/36* (2006.01)
*G01V 99/00* (2009.01)
*G06F 17/14* (2006.01)

(52) U.S. Cl.
CPC .... *G06F 17/142* (2013.01); *G01V 2210/3246* (2013.01); *G01V 2210/40* (2013.01); *G01V 2210/56* (2013.01)

(56) References Cited

U.S. PATENT DOCUMENTS

| | | | | |
|---|---|---|---|---|
| 2002/0110048 | A1 | 8/2002 | Vandenbroucke | |
| 2009/0052280 | A1* | 2/2009 | Herrmann ................ | G01V 1/28 367/53 |
| 2011/0292762 | A1* | 12/2011 | Ozdemir .............. | G01V 1/3808 367/24 |
| 2013/0028049 | A1 | 1/2013 | Pan | |
| 2014/0121981 | A1* | 5/2014 | Synnevaag ............ | G01V 1/364 702/17 |

OTHER PUBLICATIONS

Cai, Han-Peng, Zhen-Hua He, and De-Ji Huang. "Seismic data denoising based on mixed time-frequency methods." Applied Geophysics 8.4 (2011): 319-327.*

Kragh, Ed, et al. "Rough-sea deghosting using wave heights derived from low-frequency pressure recordings—A case study." SEG Technical Program Expanded Abstracts 2004. Society of Exploration Geophysicists, 2004. 1309-1312.*

International Search Report and Written Opinion of the International Searching Authority in related International Application No. PCT/EP2014/061922, dated Feb. 5, 2015.

R. L. Abma, "Least-Squares Separation of Signal and Noise Using Multidimensional Filters", A Dissertation submitted to the Department of Geophysics and the Committee on Graduate Studies of Stanford University, Aug. 1995, pp. 1-154.

L. L. Canales, "Random Noise Reduction", SEG 64th Annual Meeting, Atlanta, Georgia, Dec. 2-6, 1984, pp. 525-527.

P. Herrmann et al., "De-aliased, High-Resolution Radon Transforms", SEG Technical Program Expanded Abstracts, 2000, pp. 1953-1956.

T. Hertweck et al., "Data Stacking Beyond CMP", The Leading Edge, Acquisition/Processing, Jul. 2007.

P. Hubral et al., "An Introduction to the Common Reflection Surface Stack", EAGE 60th Conference and Technical Exhibition, Leipzig, Germany, Jun. 8-12, 1998, No. 1-19, Geophysical Division.

M. Naghizadeh et al., "Multicomponent f-x Seismic Random Noise Attenuation Via Vector Autoregressive Operators", Geophysics, Mar.-Apr. 2012, pp. V91-V99, vol. 77, No. 2.

M. Naghizadeh, "Seismic Data Interpolation and Denoising in the Frequency-Wavenumber Domain", Geophysics, Mar.-Apr. 2012, pp. V71-V80, vol. 77, No. 2.

R. Soubaras, "Prestack Random and Impulsive Noise Attenuation by f-x Projection Filtering", SEG Technical Program Expanded Abstracts, Jan. 1999, pp. 711-714, vol. 14, No. 1.

R. Soubaras, "Signal-Preserving Random Noise Attenuation by the f-x Projection", SEG 65th Annual Meeting, Los Angeles, California, Expanded Abstracts, 1994, pp. 1576-1579.

S. Spitz, "Seismic Trace Interpolation in the F-X Domain", Geophysics, Jun. 1991, pp. 785-794, vol. 56, No. 6.

D. J. Verschuur et al., "Adaptive Surface-Related Multiple Elimination", Geophysics, Sep. 1992, pp. 1166-1177, vol. 57, No. 9.

Office Action in European Application No. 14 728 233.9 dated Dec. 12, 2018. (All references not cited herewith have been previously made of record.).

* cited by examiner

600
Initialize sparseness weights
602
f = f start to f max
604
Derive radon model based on sparseness weights from previous iteration
606
Calculate sparseness weights for current iteration
608
f = f - f INC

Figure 10E:
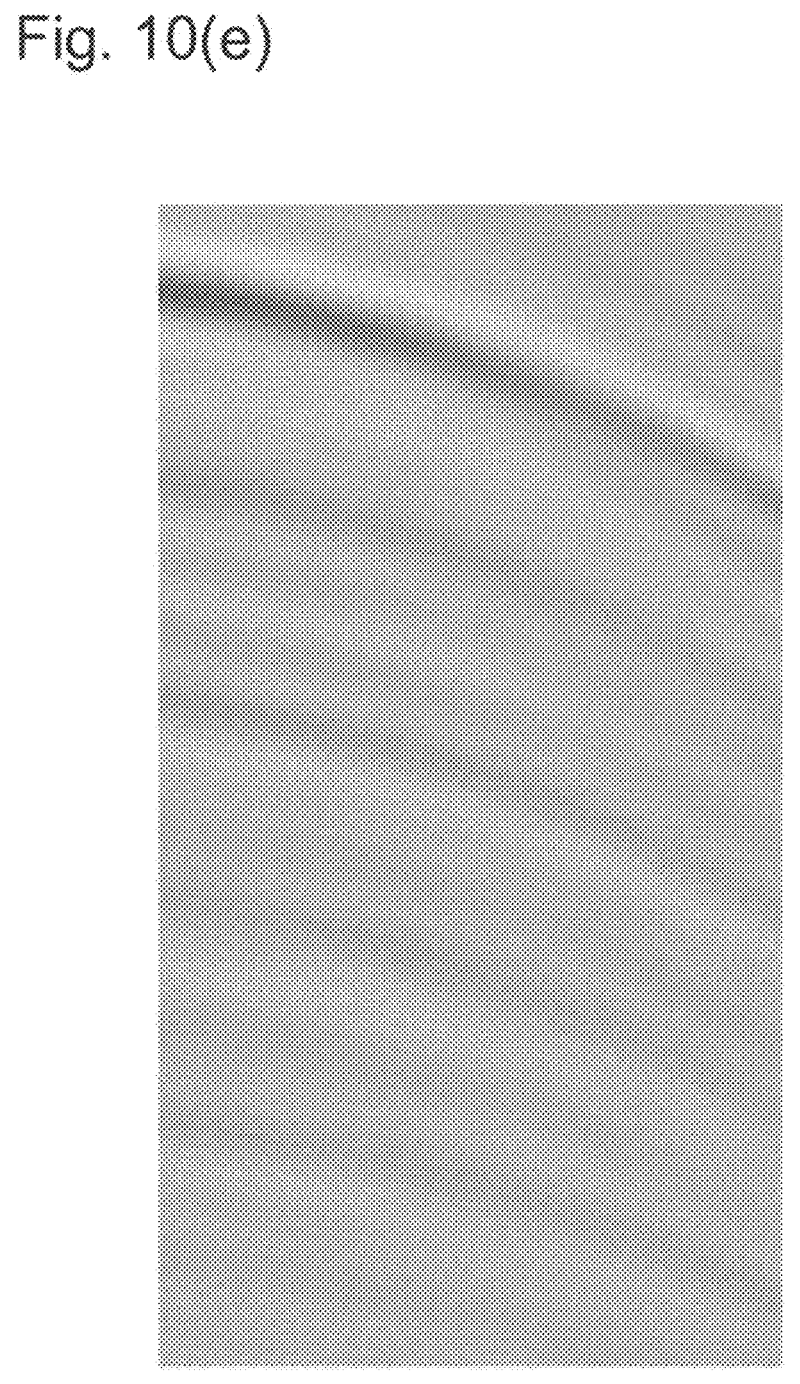

Figure 10F:
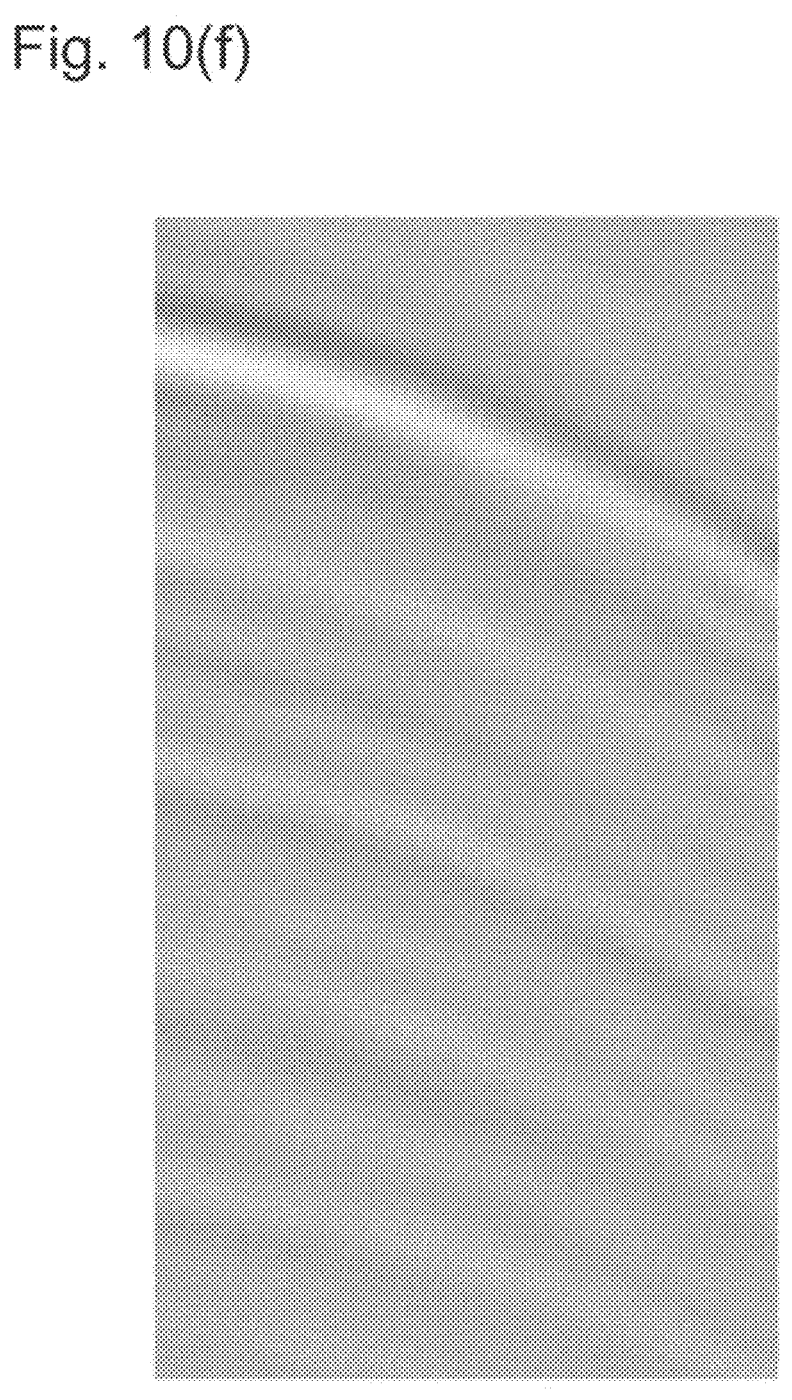

SYSTEMS AND METHODS FOR DE-NOISING SEISMIC DATA

RELATED APPLICATIONS

The present application claims priority under 35 U.S.C. § 119(e) to U.S. Provisional Patent Application Ser. No. 61/832,419, filed Jun. 7, 2013, for "Random Noise Attenuation Using Information from Frequencies with Preferential S/N Ratio", the entire contents of which are expressly incorporated herein by reference, and to U.S. Provisional Patent Application Ser. No. 61/833,047, filed Jun. 10, 2013, for "Common Reflection Surface Processing Method Applied to Marine Multicomponent Streamer Data", the entire contents of which are expressly incorporated herein by reference.

TECHNICAL FIELD

The embodiments relate generally to seismic data processing methods and systems and, more particularly, to mechanisms and techniques for de-noising a seismic data set.

BACKGROUND

A widely used technique for searching for hydrocarbons, e.g., oil and/or gas, is the seismic exploration of subsurface geophysical structures. Reflection seismology is a method of geophysical exploration to determine the properties of a portion of a subsurface layer in the earth, which information is especially helpful in the oil and gas industry. Marine-based seismic data acquisition and processing techniques are used to generate a profile (image) of a geophysical structure (subsurface) of the strata underlying the seafloor. This profile does not necessarily provide an accurate location for oil and gas reservoirs, but it may suggest, to those trained in the field, the presence or absence of oil and/or gas reservoirs. Thus, providing an improved image of the subsurface in a shorter period of time is an ongoing process.

The seismic exploration process includes generating seismic waves (i.e., sound waves) directed toward the subsurface area, gathering data on reflections of the generated seismic waves at interfaces between layers of the subsurface, and analyzing the data to generate a profile (image) of the geophysical structure, i.e., the layers of the investigated subsurface. This type of seismic exploration can be used both on the subsurface of land areas and for exploring the subsurface of the ocean floor.

Marine reflection seismology is based on the use of a controlled source that sends energy waves into the earth, by first generating the energy waves in or on the ocean. By measuring the time it takes for the reflections to come back to one or more receivers (usually very many, perhaps on the order of several hundreds, or even thousands), it is possible to estimate the depth and/or composition of the features causing such reflections. These features may be associated with subterranean hydrocarbon deposits.

Seismic waves are initiated by a source, and follow one or more paths based on reflection and refraction until a portion of the seismic waves is detected by one or more receivers. Upon detection, data associated with the seismic waves is recorded and then processed for producing an accurate image of the subsurface. The processing can include various phases, e.g., velocity model determination, pre-stack, migration, post-stack, etc., which are known in the art and thus their description is omitted here.

A traditional marine system for recording seismic waves is illustrated in FIG. 1, and this system is described in European Patent No. EP 1 217 390, the entire content of which is incorporated herein by reference. In this document, a plurality of seismic receivers 2 are each removably attached to a pedestal 4 together with a memory device 6. A plurality of such receivers is deployed on the bottom 8 of the ocean. A source vessel 10 tows a seismic source 12 that is configured to emit seismic wave 14. The seismic source may be configured to emit impulsive energy, e.g. air gun array or dynamite, or non-impulsive energy, e.g. marine vibrator. Seismic wave 14 propagates downward, toward the ocean bottom 8. After being reflected from a structure 16, the seismic wave (primary) is recorded (as a trace) by the seismic receiver 2. Those skilled in the art will appreciate that while FIG. 1 describes one example of a marine seismic acquisition system various other and different configurations are known, e.g., wherein the receivers are also towed by the vessel. Some of these other configurations will be described below.

Receivers 2 can be implemented as hydrophones or as so-called multi-component receivers. Multi-component marine acquisition uses receivers that are capable of measuring a pressure wavefield and at least one component of a particle motion that is associated with acoustic signals that are reflected/refracted versions of the signal generated by the source 12. Examples of particle motions which can be sensed by multi-component receivers include one or more components of a particle displacement, one or more components of a particle velocity (for example, inline (X), crossline (Y) and vertical (Z) components) and one or more components of a particle acceleration, i.e., vectorial motion measurements. Particle motion, particle velocity, and particle acceleration recordings may be processed to simulate each other. For example, particle acceleration recordings may be integrated in time to convert to particle velocity data. Such integration may be applied in the time domain or in the frequency domain. As such, the terms particle motion, particle velocity, and particle acceleration are used interchangeable throughout this document.

The vectorial motion measurements convey both direction and polarity information in contrast to pressure measurements which is direction independent. A 3D vector describing the incident pressure wavefield can be resolved from the apparent velocity measurements of different components, e.g., Vz, Vy, and Vx (if available). These are the vertical and horizontal, cross-line and in-line, components of the apparent velocity of particles moving within a pressure wave incident at a multi-component sensor(s). The polarization allows discrimination between upcoming and downgoing seismic energy, in addition to cross-line Y and in-line X (if available) directionality, where "in-line" may be defined as the direction of progression of the marine vessel towing the source (and streamer(s) in some cases).

In addition to receiving the desired signal associated with reflections/refractions of the seismic wave 14, receivers 2 will also receive noise. Noise can come from a variety of sources which can affect the received seismic signals in different manners. In the case of multi-component data the noise characteristic may be different for each component in terms of frequency, coherency, location or amplitude. For example, hydrophone data may be relatively clean with high signal to noise ratio at all frequencies and vertical accelerometer data may be substantially noisier at frequencies below 30 Hz. Standard de-noising techniques either rely on the noise being incoherent (f-x-deconvolution (Canales, L. L., 1984, Random noise reduction: $54^{th}$ Annual International Meeting, SEG, Expanded Abstracts, 525-527), projection filtering (Soubaras, R., 1994, Signal-preserving random noise attenuation by the f-x projection: 64$^{th}$ Annual International Meeting, SEG, Expanded Abstracts, 1576-1579), etc.) or that the noise is distinguishable in some other way (e.g., Radon demultiple discrimination on moveout).

De-noising techniques balance the efficiency of the de-noising and the preservation of the underlying signal. In practice it is often more important to protect the signal so that after processing, genuine information can be extracted. This can significantly reduce the de-noising efficiency. For that reason modern de-noising techniques try to differentiate signal and noise by including as many signal characteristics as possible such, as amplitude and direction, in order to discriminate the noise from the signal.

For example, various computer algorithms are known by those skilled in the art to process combinations of acquired seismic data to separate upcoming primary reflection wave-field from the ghosted and multiple reflection energy arising from transmitted and reflected energy re-reflected by the sea surface. However, such algorithms are complicated by the difference between the signal quality and signal to noise (S/N) ratio of marine multi-component sensor data in comparison with the pressure wave-field measured by hydrophones. The particle motion and hydrophone sensors have fundamentally different response characteristics and sensitivities. Noise characteristics differ due to their different responses to ambient noise, with motion sensors strongly influenced by the motion and vibration of the streamer as it is towed through the recording medium.

Accordingly, it would be desirable to provide methods and systems that avoid the afore-described problems and drawbacks, and which provide mechanisms for de-noising acquired seismic data.

SUMMARY

These and other problems and drawbacks are addressed by embodiments described herein which, among other things, take high signal to noise ratio (SNR) seismic data and use the high SNR seismic data to assist in de-noising lower SNR seismic data. The high SNR seismic data can be taken from data acquired using the same or different seismic receiver components as the lower SNR seismic data, from different frequency bands, and/or can be raw or processed to be more similar to the lower SNR seismic data.

According to an embodiment a method for de-noising seismic data recorded by seismic receivers includes the steps of processing a first seismic data having a first signal-to-noise ratio (SNR) to derive a denoising operator; and applying the de-noising operator to a second seismic data having a second SNR to remove noise from the second seismic data, wherein the first SNR is greater than the second SNR.

According to another embodiment, a system for de-noising seismic data recorded by seismic receivers includes at least one processor configured to process a first seismic data having a first signal-to-noise ratio (SNR) to derive a denoising operator, and also configured to apply the de-noising operator to a second seismic data having a second SNR to remove noise from the second seismic data, wherein the first SNR is greater than the second SNR.

BRIEF DESCRIPTION OF THE DRAWINGS

The accompanying drawings illustrate exemplary embodiments, wherein.

DETAILED DESCRIPTION

Figure 1:
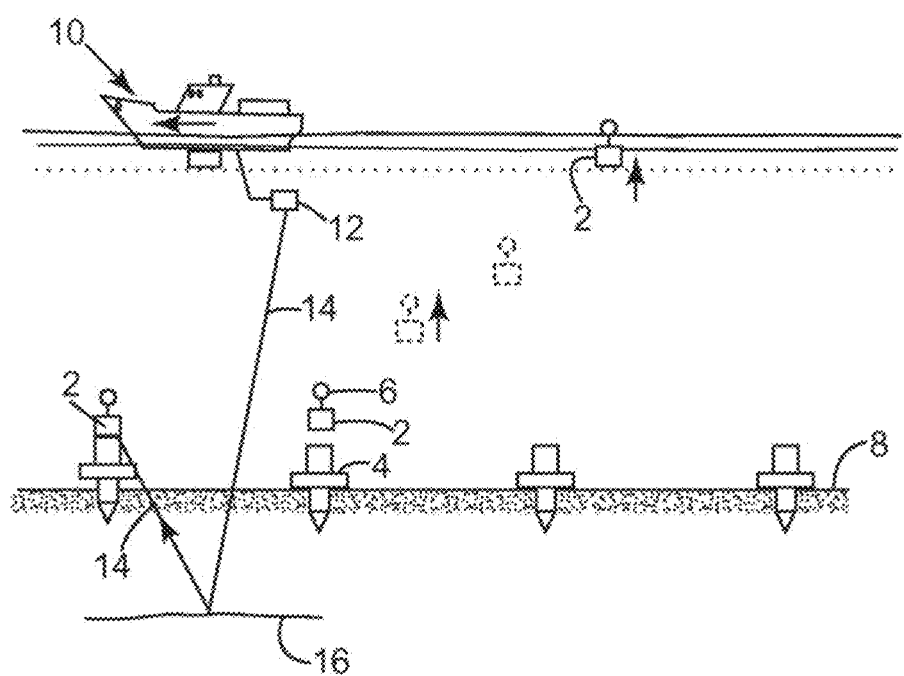
FIG. 1 illustrates a traditional marine system for recording seismic waves.

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will convey the scope of the inventive concept to those skilled in the art. The scope of the embodiments is therefore defined by the appended claims.

Reference throughout the specification to "one embodiment" or "an embodiment" means that a particular feature, structure, or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular feature, structures, or characteristics may be combined in any suitable manner in one or more embodiments.

According to embodiments, de-noising can be performed for received seismic signals in both land and marine seismic operations in environments which have a relatively high level of noise by using received seismic data having a relatively good signal-to-noise ratio (SNR) to de-noise received seismic data having a relatively poor SNR. For example, and according to one embodiment, seismic data acquired in a high frequency range can be used to help de-noise seismic data acquired in a lower frequency range. Prior to discussing these embodiments in detail, several different seismic acquisition environments, in which there is a variable and potentially high level of noise, will now described in more detail.

Figure 2:
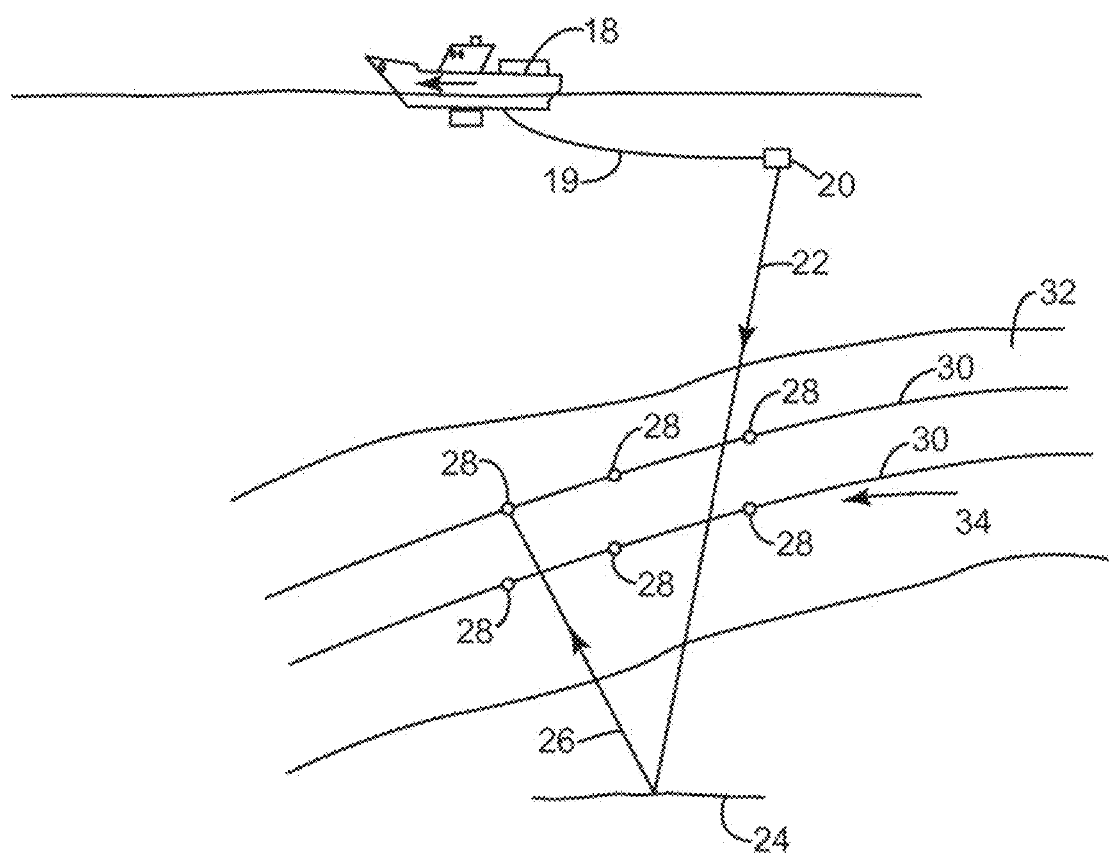
FIG. 2 depicts a ship towing a seismic source according to an embodiment.

Similar to the seismic acquisition system of FIG. 1, and according to an embodiment as shown in FIG. 2, there is a ship 18 towing a seismic source 20 which emits seismic waves (also known as seismic signals) depicted by seismic signal 22. The seismic source is attached to a cable 19. Seismic signal 22 reflects off of an interface 24, resulting in a reflected seismic signal 26 which is received by a multi-component receiver 28. The receiver 28 can include geophones (for obtaining X, Y and Z components) and a hydrophone component (for obtaining a pressure P component). A plurality of receivers 28 can be attached to a cable 30, e.g., an Ocean Bottom Cable (OBC) system. These one or more cables 30 can rest on the seabed 32 which can have a varied surface. Additionally, there can be a tidal current, shown by arrow 34, which can affect the cables 30 and their associated receivers 28, thereby introducing noise into the received data.

Figure 3:
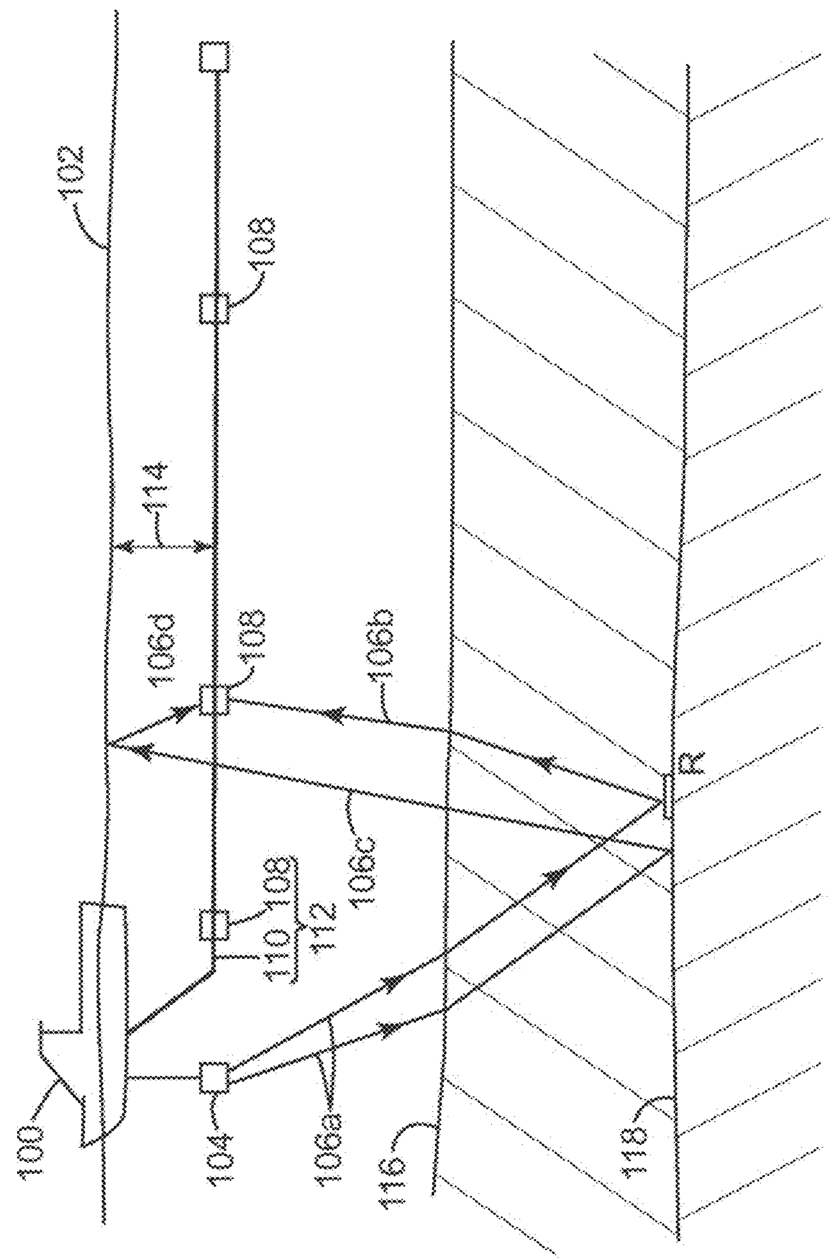
FIG. 3 depicts a ship towing a seismic source and a streamer according to an embodiment.

According to another embodiment, as shown in FIG. 3, there is a ship 100 towing a seismic source 104 which emits seismic waves (also known as seismic signals) depicted by seismic signals 106*a*. The ship 100 also drags an array of acoustic detectors or receivers 108 that are provided on cable 110. The detectors 108 and the cable 110 are sometimes referred to as a streamer 112; and the ship 100 may drag a plurality of streamers 112. The streamers 112 may be horizontal, i.e. lying at a constant depth 114 relative to a surface 102 of the ocean, or slanted or have a curved profile. The detectors may carry pressure sensors (e.g., hydrophones) and/or particle motion sensors (e.g., geophones, particle velocity sensors or accelerometers). The acoustic wave 106*a* propagates downwards toward the seafloor, and penetrates the seafloor until eventually a reflector (R), on a layer interface 118, reflects some of the acoustic wave energy. The reflected acoustic wave 106*b* propagates upwardly until it is detected by detector 108.

Another reflected acoustic wave 106*c* propagates upwardly to the surface 102 and is then reflected back, 106*d*, to be detected by detector 108. The recorded data related to the detected waves is then processed to produce an image of the subsurface being illuminated by the seismic waves. This data processing typically includes various phases, e.g., de-noising techniques, velocity model determination, migration, move-out, etc., these techniques are known to those skilled in the art and thus, their description is omitted herein. In the context of marine seismic acquisition systems, noise can be introduced into the recorded data by one or more of: swell noise (e.g., noise associated with ocean currents or water turbulence behind the vessel), hydrostatic pressure noise (e.g., noise associated with streamer buckling based on ocean swells and the height of the water column over the streamer), tugging, twisting or strumming noise from the towing vessel or streamer steering devices, propeller cavitation noise, interference from other nearby vessels which are performing seismic acquisition, simultaneous shooting noise, multiples, electronic noise, turn noise (noise generated when a vessel turns), time-lapse difference noise, coupling noise, shark bite noise, shear wave noise, migration swing noise, ground or mud roll.

Figure 4:
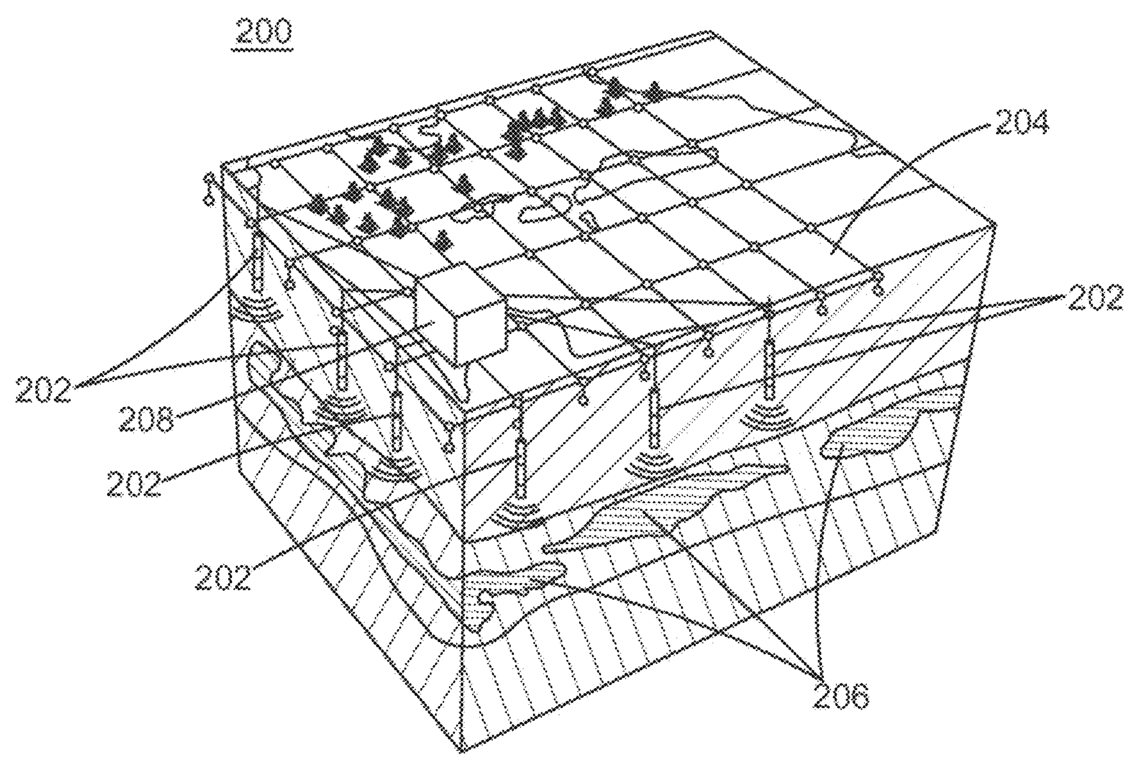
FIG. 4 shows a schematic diagram of a land seismic survey system according to an embodiment.

The seismic acquisition systems of FIGS. 2 and 3 are used in marine environments. However the de-noising techniques to be described below are not limited to data acquired from marine seismic systems. For example, and according to another embodiment as shown in FIG. 4, a land seismic survey system 200 includes one or more sources 202 configured to generate seismic waves in the rock formation 206 and a grid of detectors 204 connected to a data processing unit 208. The grid of detectors 202 is often regular (i.e., the detectors are arranged at regular intervals along orthogonal directions), but may be arranged irregularly, and individual detectors may be located at different elevations from one another. While the detectors 204 are frequently kept at known positions for long periods, one or more seismic sources 206 may be relocated to different positions during the acquisition. In the context of land seismic acquisition, noise can be introduced into the recorded data by, for example, one or more of wind, rain/sleet, injector pumps, injection wells, pipelines, oil-production pumps, vehicle traffic, livestock/wildlife, lightning, ground roll, noise related to moving equipment (e.g. Vibroseis trucks, geophones or other equipment), coupling and/or power lines.

Regardless of the manner in which the seismic data is acquired, it is to be expected that it will be negatively impacted by noise. However the impact of noise will not typically be uniform across the recorded seismic dataset. For example, many of the noise mechanisms described above with respect to marine seismic acquisition generate noise in a low frequency range, e.g., 1-10, 1-15, 1-20 or 1-30 Hz. Thus it may be expected that the acquired seismic data in a higher frequency range, e.g., greater than 10, 15, 20 or 30 Hz will have a better signal-to-noise ratio (SNR) than the acquired seismic data in the lower frequency range. In a further embodiment, more than one measurement (e.g. component) of the wavefield may be recorded. It may be that one measurement of the wavefield has a higher signal to noise ratio compared to another measurement of the wavefield, at least at some frequency range. In the case that a seismic survey already exists in the acquisition area, there may be access to one or more datasets which may have more or less noise than the dataset being acquired. For example, earlier datasets using older acquisition technology may be inherently noisier. In this case, embodiments can derive an operator from the recordings with high signal to noise ratio to attenuate noise in the dataset with low signal to noise ratio. In one embodiment, the high signal to noise ratio is greater than one. The dataset with higher signal to noise ratio may be processed to generate data with similar behavior to the dataset with low signal to noise ratio. This processed data may then be used to help attenuate noise in the low signal to noise ratio data. According to embodiments discussed herein, techniques are described which exploit this difference in data quality to use higher quality seismic data to help de-noise lower quality data.

Generally speaking, the strategy may be considered to consist of two stages. The first stage involves building an operator from the data with high SN ratio. The operator may relate to a masking function, spatial smoothing function, convolutional filter, or another operator. In the second stage, the operator is used to attenuate noise in the low SN ratio data. The low and high SN ratio datasets may relate to the same recorded component, different recorded components (e.g. hydrophone and particle acceleration or velocity), different surveys, or may be a combination. The datasets may be processed to make the noise attenuation more efficient. Processing the recorded data may include processing hydrophone data to simulate particle motion data, processing particle motion data to simulate hydrophone data, or applying wavefield separation to particle motion and hydrophone data. The step of processing may or may not include obliquity correction. These processing strategies may be used for any of the denoise techniques disclosed. Any of the methods may be applied on gathers of data, e.g. shot gathers, or in spatio-temporal windows.

According to one embodiment, prediction filters are generated from seismic data acquired at one or more high frequencies to de-noise seismic data acquired in one or more lower frequencies. More specifically, and as an example, a prediction filter is derived based on seismic data acquired at a frequency 2F which is then applied to seismic data acquired at frequency F (with double the spacing) to de-noise the data at frequency F as illustrated in the flow diagram of FIG. 5. The use of convolution operator spacing and frequency ratios was used for fx interpolation in Spitz, S., 1991, Seismic trace interpolation in the F-X domain, Geophysics, 56, 785-794 where fx convolution operators for low frequencies were used for the interpolation of higher frequencies at half the spacing.

Therein, a spatio-temporal window of data to be de-noised is formed at step 500. The window may be tapered in time (e.g. cosine squared or linear taper) to avoid Fourier edge effects. The size of the window should be defined so that the seismic events of interest in the window are approximately linear. Then, at step 502, the window of data is Fast Fourier Transformed (FFT) in the time direction (i.e., transforming the data from the t-x domain to the f-x domain). For this de-noising application, it is desirable to find the filter which predicts a data point from the previous data points. Accordingly, at step 504, a prediction filter associated with the higher frequency data is obtained by solving the following equation at a frequency 2F:

$$d = Lf$$

$$\begin{pmatrix} d_3 \\ d_4 \\ d_n \end{pmatrix} = \begin{pmatrix} d_1 & d_2 \\ d_2 & d_3 \\ d_{n-2} & d_{n-1} \end{pmatrix} \begin{pmatrix} f_1 \\ f_2 \end{pmatrix}$$

where d is the input data having as a subscript the trace number associated with the data from 1 to n, and, in this example, a two point prediction filter associated with 2F $(f_1,f_2)$ is generated. As will be appreciated by those skilled in the art, the equation above may be solved, and the prediction filter found, by using one of a number of different techniques including, but not limited to, least squares inversion solved with LU decomposition, Cholesky decomposition, conjugate gradients, etc. Moreover, instead of using least squares (12 norm) another norm to make the filter sparse (e.g. 11 or Cauchy norm) may be chosen.

The filter derived in step 504 is then used at step 506 to de-noise the seismic data at frequency F by calculating:

$$\begin{pmatrix} d_5 \\ d_6 \\ d_n \end{pmatrix} = \begin{pmatrix} d_1 & d_3 \\ d_2 & d_4 \\ d_{n-4} & d_{n-2} \end{pmatrix} \begin{pmatrix} f_1 \\ f_2 \end{pmatrix}$$

Here the algorithm now operates on frequency F, but using the filter derived from frequency 2F. This approach is valid in the case that the linearity of the events at frequency 2F is consistent with the events at frequency F. According to other embodiments, the method of FIG. 5 may be extended to utilise projection filters instead of prediction filters; which filters are generally described in the article entitled "Prestack random and impulsive noise attenuation by f-x projection filtering" to R. Soubaras, published in SEG Expanded Abstracts 14, 711-714, 1995. The filters may be considered as a convolution in space. Those skilled in the art will appreciate that a convolution in the spatial domain is equivalent to a multiplication of the functions in the spatial-frequency domain. Therefore, instead of convolving the filter with the data in the fx domain, both the filter and data may be transformed into the FK domain, following which they may be multiplied together. The operator in the FK domain may be further processed to help separate signal and noise.

Numerous variations and modifications are contemplated as other embodiments. For example, the seismic data input to the method of FIG. 5 may be in the shot domain, channel domain, common receiver domain, CMP domain, or any pre-stack domain. It may also be in a model domain, for example tau-p transform each shot gather and apply the method of FIG. 5 in the common p domain. In addition the filter may be extended beyond one spatial dimension, e.g. shot-channel domain or shot-channel-streamer domain. The filter may be derived on more than one frequency at the same time, e.g. 2F, 3F, etc. This modification can improve the quality of the filter, especially if the frequency 2F is in a ghost notch where the SNR can be low.

According to other embodiments, reverse prediction filters can be derived and used to de-noise data as:

$$\begin{pmatrix} d_1 \\ d_2 \\ d_{n-2} \end{pmatrix} = \begin{pmatrix} d_3 & d_2 \\ d_4 & d_3 \\ d_n & d_{n-1} \end{pmatrix} \begin{pmatrix} f_1 \\ f_2 \end{pmatrix}$$

or a combination of forward and reverse filters can be derived by making use of the complex conjugate as follows:

$$\begin{pmatrix} d_1^* \\ d_2^* \\ d_3^* \\ - \\ d_3 \\ d_4 \\ d_n \end{pmatrix} = \begin{pmatrix} d_3^* & d_2^* \\ d_4^* & d_3^* \\ d_5^* & d_4^* \\ - & - \\ d_1 & d_2 \\ d_2 & d_3 \\ d_{n-2} & d_{n-1} \end{pmatrix} \begin{pmatrix} f_1 \\ f_2 \end{pmatrix}$$

Figure 5:
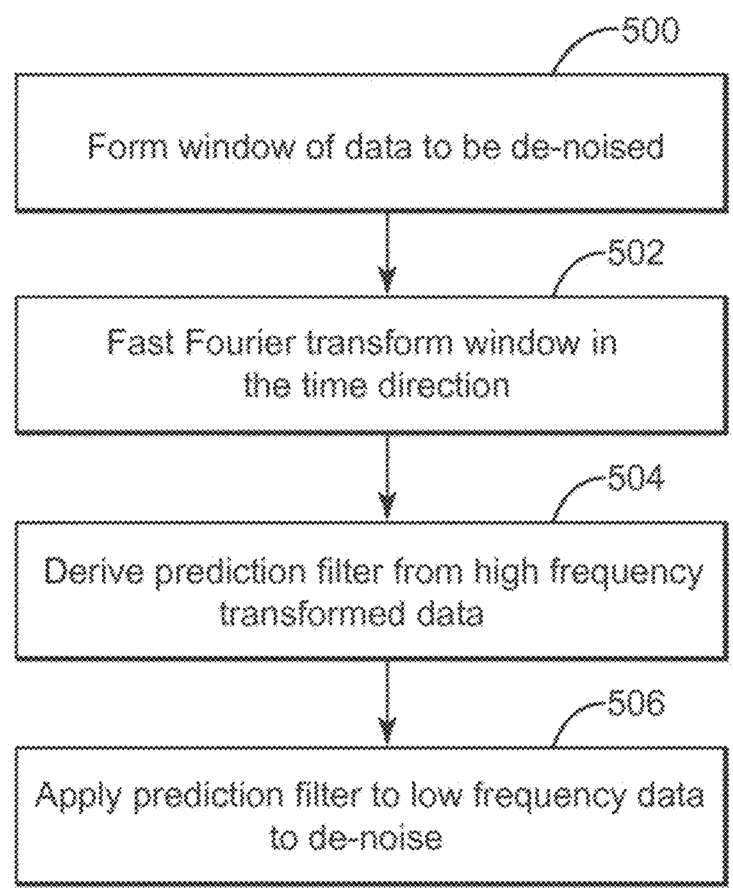
FIGS. 5-8 are flowcharts illustrating de-noising techniques according to embodiments.

The method of FIG. 5 may also be applied using time domain prediction operators. Such an embodiment would enable derivation of a filter on a high band pass version of the seismic input data, and then applying the filter on a lower frequency range to perform de-noising.

Where more than one component is available in the seismic receiver, it would also be possible to derive the filter using hydrophone (pressure) component data (where the SNR is often good) and apply the filter on the particle motion (e.g., geophone or accelerometer) data. In this case, a filter may be derived at frequency F on the hydrophone data and applied to frequency F on the particle motion data. There is an inherent difference in the polarity of ghost energy on the pressure component compared to vertical particle motion data. In some cases it may be necessary to process one or more of the recorded datasets in order that the low and high SN ratio data are consistent. For example, pressure component data may be processed to simulate data that is more similar to a particle velocity component. This process may involve deghosting the pressure component, calculating the ghost model, reversing the polarity of the ghost model, and adding the ghost model back to construct a clean pseudo-Vz dataset from which to derive the filter (fx or time domain). This process could require correct obliquity preparation of the synthesised Vz. These processes may be applied in 2D or 3D as necessary. The resulting particle velocity data could be integrated if using particle motion data, or differentiated to make it consistent with accelerometer recordings. Other calibration factors could be required to compensate for water density or general sensitivity differences between hydrophone and accelerometer data. According to other embodiments, filters could be derived simultaneously on pressure and velocity components. For example, by solving:

$$\begin{pmatrix} d_{5h} \\ d_{6h} \\ d_{nh} \\ d_{5p} \\ d_{6p} \\ d_{np} \end{pmatrix} = \begin{pmatrix} d_{1h} & d_{3h} \\ d_{2h} & d_{4h} \\ d_{(n-4)h} & d_{(n-2)h} \\ d_{1p} & d_{3p} \\ d_{2p} & d_{4p} \\ d_{(n-4)p} & d_{(n-2)p} \end{pmatrix} \begin{pmatrix} f_1 \\ f_2 \end{pmatrix}$$

where the subscript "h" in the top portion of the vector and matrix refers to hydrophone data and the "p" in the subscripts of the lower portion of the vector and matrix refers to particle velocity data.

The foregoing embodiments describe techniques for deriving filters from seismic data sets having a good SNR and using those filters to de-noise seismic data sets having a lower SNR. According to other embodiments, model derivation techniques can be used to accomplish similar objectives.

For example, high resolution parabolic Radon transformation is a modelling method used routinely in seismic data processing to remove multiples reflections from acquired seismic data sets. As will be appreciated by those skilled in the art, multiples are reflections of the acoustic waves generated by the source(s) which have reflected more than once prior to being detected by the receivers in a seismic acquisition system and, generally, are preferably removed from the data set. Often applied in spatio-temporal windows in the frequency domain, the parabolic Radon method derives model sparseness weights on low frequencies which are not aliased to constrain the model for high frequencies where aliasing is present. Once the model has been derived, multiple energy is distinguished from primary energy based on moveout discrimination. The multiple energy is reverse transformed back to the input data space, and is finally subtracted from the input data. Time domain Radon methods also exist, and it is also possible to use different model space definitions; e.g. hyperbolic Radon or shifted-hyperbolic Radon.

Figure 6:
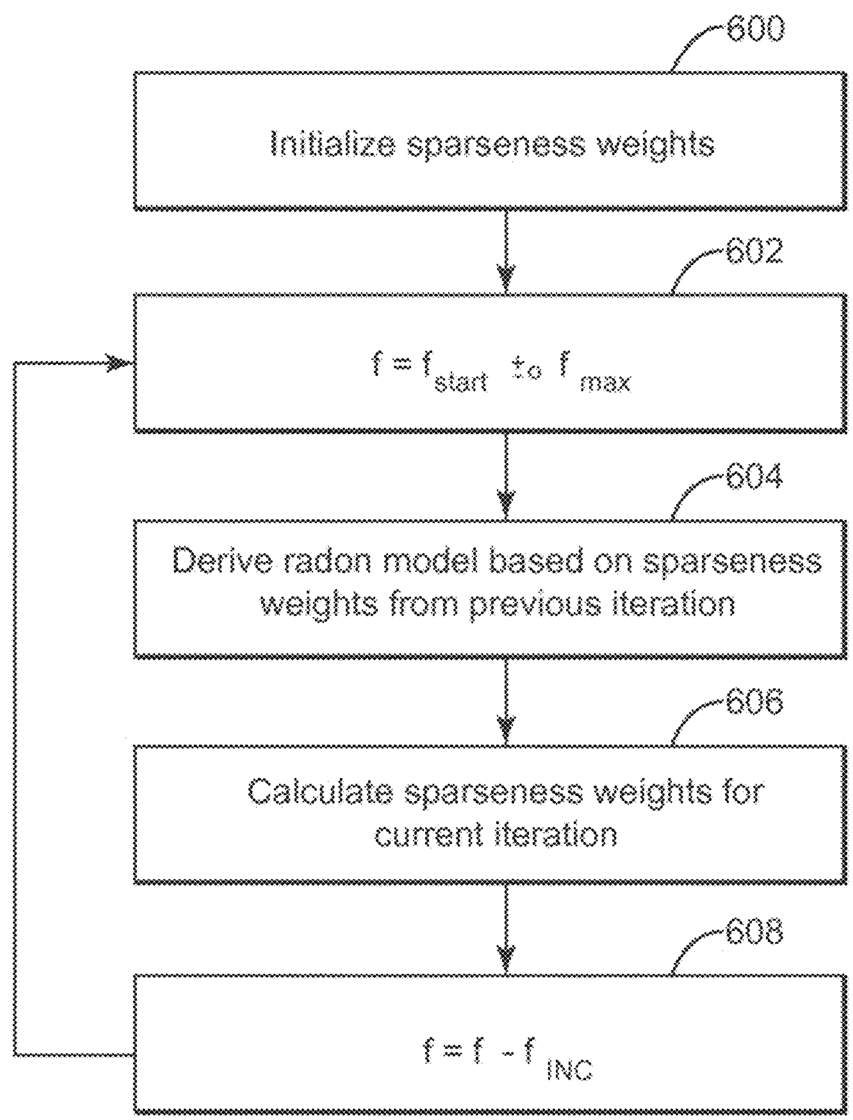

However, embodiments described herein propose to use the Radon model to denoise seismic data instead of removing multiples as described above. In this context, the method of FIG. 6 can be performed according to an embodiment. Therein, the initial sparseness weights are initialized to one at step 600. Then, at step 602, a sparseness iteration loop begins having frequency iterations from $f_{start}$ to $f_{end}$, with an increment of $f_{inc}$. As a purely illustrative example, the frequency iterations could be set as: $f_{start}$=60 Hz, $f_{end}$=5 Hz, and $f_{inc}$=−10 Hz. At step 604, the Radon model is derived based on sparseness weights from previous iteration for frequency range $f_{start}+f_{inc}$*iteration to $f_{end}$ in a manner which will be known to those skilled in the art as part of the high resolution Radon transform process. At step 606, sparseness weights are calculated for the current iteration. In the embodiment of FIG. 6, thus, sparseness weights are initially derived for data in a high frequency range with good signal to noise ratio. The low frequency limit of the Radon transform is gradually reduced via step 608, but the result will always be constrained by the initial high frequency result. The reader interested in more information regarding Radon transforms or modelling, per se, is directed to the article by Herrmann, P., T. Mojesky, M. Magesan, and P. Hugonnet, 2000, entitled "De-aliased, high-resolution Radon transforms: 70th Annual International Meeting", published in SEG, Expanded Abstracts, 1953-1956, the disclosure of which is incorporated here by reference. Instead of using iteratively re-weighted inversion as described earlier, an anti-leakage solver may be used wherein as each model parameter is derived it's effect may be subtracted from the input data. The high SN ratio data may be used to steer the decomposition order of the model parameters for the low SN ratio data. Another option may be to derive a model for hydrophone and particle velocity data independently. As the hydrophone data has a low noise level, we may consider that areas of low amplitude or low semblance relate to background noise. A scaling operator may be defined based on these low amplitude zones and applied to derive a noise model from the particle velocity model which is reverse transformed and subtracted from the input particle velocity data.

Various other modifications can be made to the embodiment of FIG. 6. For example, the Radon transform may be performed along any suitable function, e.g. linear, parabolic, hyperbolic, etc. Formulations using different domains are also possible, e.g. FK (frequency-wavenumber). For example, both the hydrophone and the particle velocity data can be FK transformed. The data may be compared in the FK domain, and areas of low amplitude for the hydrophone data may be defined as noise regions for the particle velocity data. These noise regions may be reverse transformed back to the x-t domain and subtracted from the input data. As an alternative, signal regions may be defined and the noise regions scaled down following which the signal is reverse transformed to the space-time domain.

As an alternative the particle velocity data may be transformed to the FK domain on its own. Based on the principle of consistent dips from low to high frequencies, the high frequency data with a good signal to noise ratio may be used to derive a masking function for low frequency data. The masking function may be used to derive a noise model which is reverse transformed to the x-t domain and subtracted from the input data. Alternatively a masking function to preserve signal may be derived and applied, following which the signal model is reverse transformed to the x-t domain.

For any of the denoising strategies according to the embodiments described herein, recorded seismic datasets may be processed and/or combined to form low and high SNR datasets where the selection of signal and noise areas is more reliable. Different seismic receiver components (e.g. hydrophone and Vz data) or processed versions thereof may be combined to form the low and high SNR datasets. To illustrate this pre-denoising processing and/or combining in a visual way, consider the following discussion along with FIGS. 10(*a*)-10(*m*) which illustrate seismic data graphically through various stages in the processing.

Therein, FIGS. 10(*a*) and 10(*b*) show raw hydrophone and particle velocity data (in this case an integration of particle acceleration also referred to as Vz data), respectively. FIGS. 10(*c*) and 10(*d*) show the input data of FIGS. 10(*a*) and 10(*b*), respectively, after 10 Hz to 45 Hz bandpass filtering. The bandpass filtering is not necessarily required for this process and is for illustration purposes only.

One embodiment includes wavefield separation of the hydrophone data (up-going waves seen in FIG. 10(*e*) and down-going waves seen in FIG. 10(*f*)). The estimated down-going data shown in FIG. 10(*f*) is added to the Vz data of FIG. 10(*d*), with or without obliquity correction, for an approximate deghosting of Vz data shown in FIG. 10(*i*). In this embodiment the high SNR dataset will be a deghosted hydrophone data (shown in FIG. 10(*e*)), and the low SNR dataset will be a deghosted Vz data (shown in FIG. 10(*i*). Removing the ghost from both components in this embodiment forms two consistent datasets for selection of signal and noise areas. After denoising, the down-going data removed for the wavefield separation may be added back to the result.

Another embodiment includes processing the hydrophone data to simulate Vz data. This may include performing wavefield separation of the hydrophone data and recombining up-going (FIG. 10(*e*)) and down-going (FIG. 10(*f*)) datasets with a reverse in polarity of the down-going wavefield. This synthesised dataset (shown in FIG. 10(*g*) may be used as the high SNR data), and the Vz data (shown in FIG. 10(*d*) may be used as the low SNR data.

In another embodiment, the Vz data may be modified to simulate hydrophone data. As in the previous embodiments, a wavefield separation of hydrophone data makes an estimate of up-going (FIG. 10(*e*)) and down-going (FIG. 10(*f*)) data. The down-going data may be added twice to the recorded Vz data to reverse the polarity of the ghost in the Vz data, the resulting data set being shown in FIG. 10(*m*). In this embodiment, the high SNR data is the recorded hydrophone data (FIG. 10(*c*)) and the low SNR data is the combined Hydrophone/Vz data (FIG. 10(*m*)). After denoising, the down-going data that was added twice into the Vz data may be subtracted.

In yet another embodiment, the synthesised Vz data (originating from hydrophone data) shown in FIG. 10(*g*) may be subtracted from the recorded Vz data shown in FIG. 10(*d*) to reduce the SNR of the low SNR dataset, the result being shown in FIG. 10(*h*). By doing this, the high SNR dataset may be the synthesised Vz data (FIG. 10(*g*)), and the low SNR dataset may be the recorded Vz data minus the synthesised Vz data (FIG. 10(*h*). A comparison of amplitude in the model domain may thus relate to a signal to noise ratio which may be thresholded to separate regions affected by signal and noise. Phase comparisons, for example using the dot product between recorded and synthesised Vz data, may also be combined with the amplitude ratio to further help distinguish signal and noise regions. Noise regions may be reverse transformed and subtracted from the recorded Vz data. In this case the masking function is derived using the comparison of a high SN ratio dataset (synthesised Vz data) with two low SN ratio datasets (noise data and recorded Vz data).

Those skilled in the art will appreciate that other combinations of processed data may be compared prior to performing the denoising described above, e.g. down-going datasets such as the down-going hydrophone wavefield (shown in FIG. 10(*f*)) being compared with the result (shown in FIG. 10(*j*)) of the Vz data of FIG. 10(*d*) minus the up-going hydrophone data of FIG. 10(*e*) or the results shown in FIGS. 10(*k*) and 10(*l*), which show a sum of the hydrophone data in FIG. 10(*c*) plus the Vz data of FIG. 10(*d*) and a subtraction of the Vz data of FIG. 10(*d*) from the hydrophone data in FIG. 10(*c*), respectively.

While the above discussion has focussed on the use of Vz data, the same principles may apply to particle motion data orientated in any direction, e.g. Vy direction. Alternatively the orientation of particle motion sensors within a dataset may vary, for example with cable feather. As an alternative to the integration of accelerometer data to calculate particle velocity data, hydrophone data may be processed to compare with accelerometer data rather than particle velocity data through the use of differentiation. The use of integration and differentiation in this way is well known in the art and may be applied in the time or frequency domain.

Areas to be defined as signal or noise based on a comparison of the high and low SN ratio data may be based on many criteria, for example coherency, semblance, maximum percentage of energy, signal to noise ratio, similarity in phase between high SNR and low SNR data, normalised root mean square error (NRMS), RMS difference, amplitude ratio, eigenvector similarity, eigenvalue similarity, etc. A combination of these measures may be used. The strategy may only be applied in the frequency range substantially affected by noise. An implementation in higher dimensions may also be imagined, e.g. f-$k_{short}$-$k_{receiver}$, f-$k_{short}$-$k_{channel}$, tau-px-py in the shot-channel domain, or tau-qx-py where q relates to parabolic model in the offset direction and linear model in the channel direction. The high resolution Radon procedure outlined above may also be implemented in the time domain. Using masking strategies based on high to low frequencies and/or from clean and noisy datasets using other model domains may be used, e.g., curvelets, frequency-wavenumber (FK), contourlets, ridgelets, least squares migration, CRS (common reflection surface) based denoise, singular value decomposition (SVD), rank reduction, etc. CRS based de-noising according to other embodiments is described below. In the case of curvelets, embodiments can decompose a first dataset with high signal to noise ratio into the curvelet domain, and transform a second dataset with low signal to noise ratio into the curvelet domain. The dataset with good signal to noise ratio may be used to attenuate noise in the dataset with poor signal to noise ratio. This selection of signal and noise areas is similar to selecting signal to noise ratio areas in other domains, e.g. tau-p, FK, Radon, etc. The comparison may be based purely on amplitude, e.g. using the envelope of the data, or may be based on other comparisons, e.g. time shift between the data, phase difference between the data, amplitude of an adaption operator, NRMS, coherency, a combination of the above or another comparison measure.

Where more than one component is available, it can be possible to derive sparseness weights on the clean component (e.g. hydrophone) and use these sparseness weights for a decomposition on the noisy component (e.g. particle motion sensor). Alternatively, the weights may be derived using Radon models of both components simultaneously.

For any of the methods disclosed it may be beneficial to pre-process one or more of the components to make the high and low S/N ratio datasets more similar. One embodiment includes pre-processing the hydrophone data to synthesise particle velocity data. This may involve wavefield separation of the hydrophone to change the polarity of the ghost on the hydrophone component to make it consistent with data associated with detected wave velocity in the z-direction (Vz). Such processes may be applied in 2D or in 3D and include obliquity correction as necessary.

Alternatively embodiments may use the wavefield separation of the hydrophone data to generate an estimate of up-going and down-going data. The down-going estimate may be added to the Vz data (either with or without obliquity correction) to attenuate down-going energy in the Vz data. Embodiments may then consider the dataset with high S/N ratio to be the up-going component of the wavefield separated hydrophone data, and the data with low S/N ratio to be the result of the summation of the Vz data with the down-going component calculated by wavefield separation of the hydrophone data. In this case embodiments have pre-processed both hydrophone and Vz data to generate comparable datasets with high and low S/N ratio for the denoise algorithm.

Yet another strategy involves subtracting the synthesised Vz (calculated for example from hydrophone data) data from the Vz data to generate a Vz noise data. Embodiments may then compare the synthesised Vz dataset (high S/N ratio) with the Vz noise dataset to calculate a S/N ratio. This S/N ratio (in combination with other measures as required) may then be used to derive a scaling function to suppress areas of noise. After application of this process, embodiments may add the synthesised Vz data back to the result. The strategy discussed with regards to Vz may be applied to particle motion, velocity, or acceleration orientated in other directions. With any of the schemes using datasets processed to be consistent for low and high S/N ratio, instead of masking model areas contaminated by noise, embodiments may replace the noise energy with energy from the high S/N ratio guide dataset.

It should be noted that the use of all schemes detailed herein may be used for the denoising of more than one dataset with high SNR. For example consider the case that hydrophone, Vz, and Vy data is received. Hydrophone data may be processed to simulate Vz data and both the simulated Vz and recorded Vz data transformed to the FK domain. Amplitude ratio and phase difference calculations may be used to derive a masking function to isolate noise in the Vz data as described earlier. Instead of deriving a masking function in a similar way for the FK transform of the Vy data, it is also possible to use the masking function derived using Vz data for the Vy dataset. This approach is viable as the kinematics of energy in hydrophone, Vz, and Vy data are shared. This means that as all the datasets record the same pressure wavefield, the local dip and timing of the events is shared.

According to another embodiment, a first portion of acquired seismic data having a higher signal to noise ratio can be analyzed using common reflection surface (CRS) processing to derive CRS operators associated therewith. Those CRS operators can then be used to guide the CRS processing of a second portion of the acquired seismic data, e.g., data acquired via another component with a lower signal to noise ratio than that used to acquire the first portion of the seismic data.

CRS processing, per se and as will be appreciated by those skilled in the art, firstly involves an analysis of coherent energy illuminated by sources at points S(x,y,z) and recorded at sensors at points R(x,y,z) from a time recorded subsurface reflection surface (x,y,t) to determine characteristics of the reflecting surface itself which collectively define a local kinematic operator or time surface. Secondly CRS gathers energy from a local aperture in (x,t) for 2D and (x,y,t) for 3D, and optimally stacks it over the said time surface. CRS analysis of multi-component data, to determine the surface operator normals and paraxial raypaths, which notionally contribute to the same sub-surface reflection, has to take account of the polarity of the measured vector wave-field. For the reader interested in CRS processing per se, attention is directed to the article entitled "An introduction to the common-reflection-surface stack", to Hubral et al. (EAGE 1998 Annual Convention), the disclosure of which is incorporated here by reference and the article entitled "Data stacking beyond CMP", and to T. Hertweck, J. Schleicher, J. Mann (July 2007 The Leading Edge), the disclosure of which is also incorporated here by reference.

The CRS process described above can be used, according to another embodiment, sequentially on different portions of the acquired seismic data to provide better results. For example, and with reference to FIG. 7, at step 700 the CRS process can be applied to a first portion of the acquired seismic data which has a good SNR to generate the surface (s) used in the CRS process, i.e., to generate the CRS operator(s). As with previous embodiments, this first portion of data can be data from a particular component of a multi-component receiver, e.g., a hydrophone, or it can be data associated with a particular frequency or range of frequencies from one or more components, that is selected because it is expected to have less noise than other data portion(s). Importantly the CRS analysis of the hydrophone data delivers a kinematic CRS operator which is directly appropriate for gathering a different portion of the acquired seismic data, e.g. a vector dataset, independent of the polarization differences present in vector data. At step 702, the CRS surface(s) or operator(s) are applied to a second portion of the data to de-noise by optimally stacking that data along the surface(s). As with previous embodiments, this second portion of data can be data from a different component than that which generated the first portion of data, or it can be associated with a different particular frequency or range of frequencies than that which is associated with the first portion of data.

As will be appreciated from the foregoing, a number of methods using model filtering, derivation and/or CRS may be used to denoise data. Among other things, these embodiments provide the capability to use seismic data from one component, or frequency or frequency range, with good S/N ratio, to constrain the denoising of seismic data from another component, or frequency or frequency range. The frequency ranges may overlap, and may be from different datasets or components. The methods may be in one or more spatial dimensions.

Figure 7:
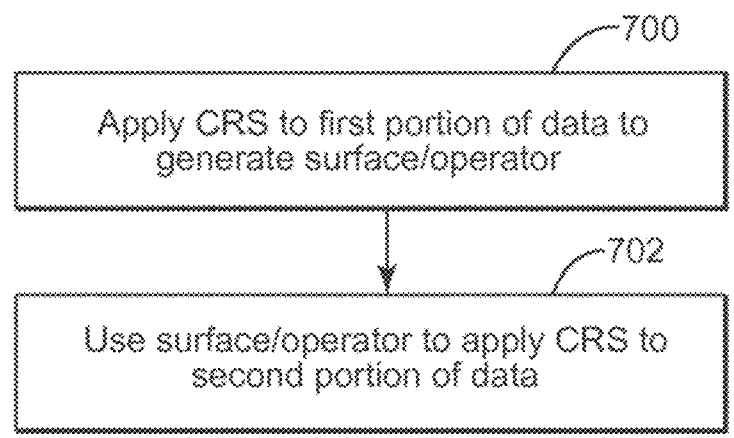
Figure 8:
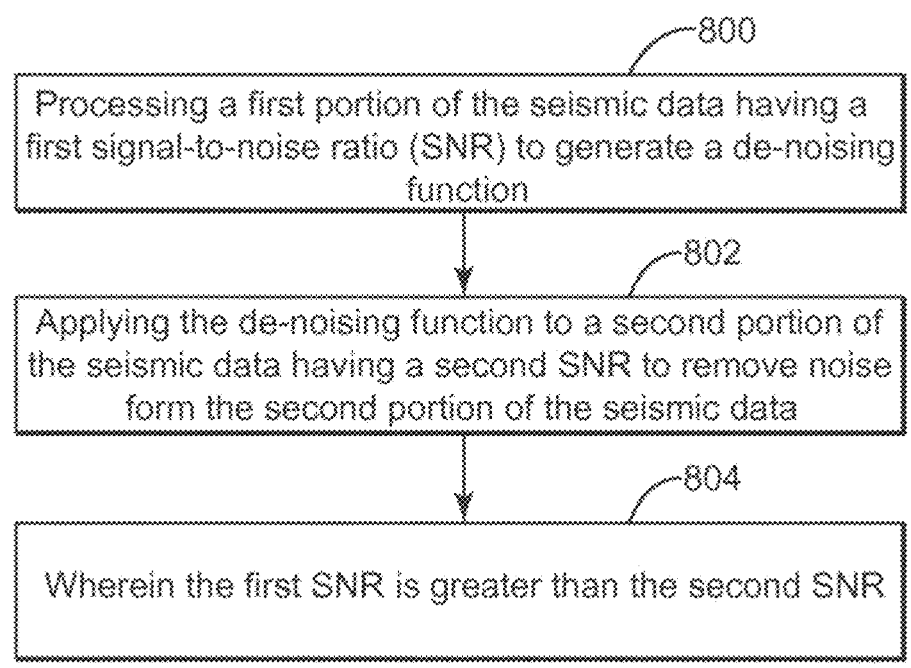

Thus, the method flows of FIGS. 5-7 can be further generalized in a number of ways. One example is provided in the embodiment of the flow diagram of FIG. 8. Therein, a method for de-noising seismic data recorded by seismic receivers includes the steps of processing (800) a first portion of the seismic data having a first signal-to-noise ratio (SNR) to generate a de-noising operator; and applying (802) the de-noising operator to a second portion of the seismic data having a second SNR to remove noise from the second portion of the seismic data, wherein (804) the first SNR is greater than the second SNR. Thus, de-noising functions include, but are not limited to, filters, models and CRS operators, as described above.

Figure 9:
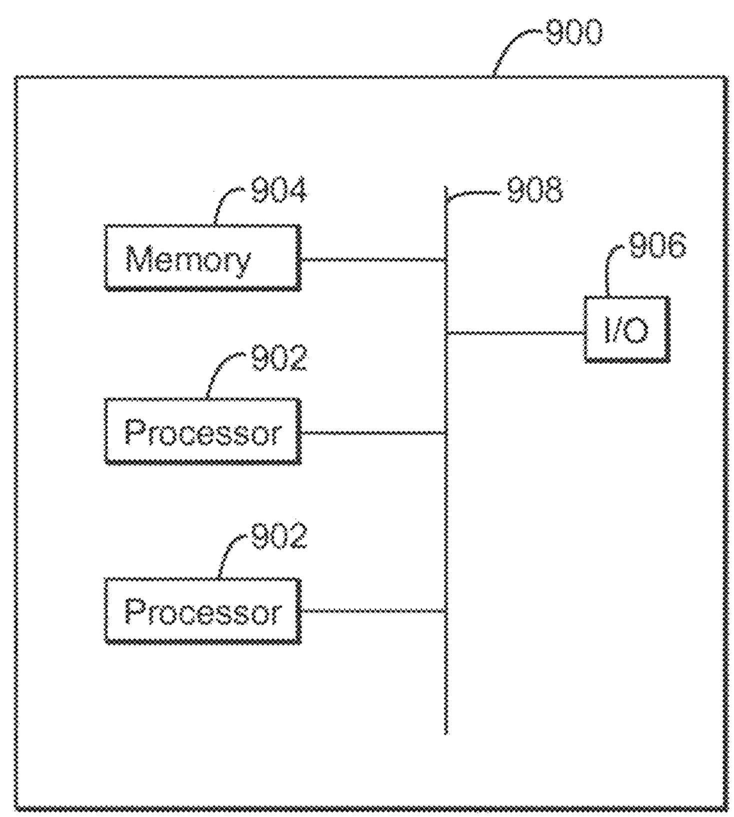
FIG. 9 shows a computing device according to an embodiment.
Figure 10A:
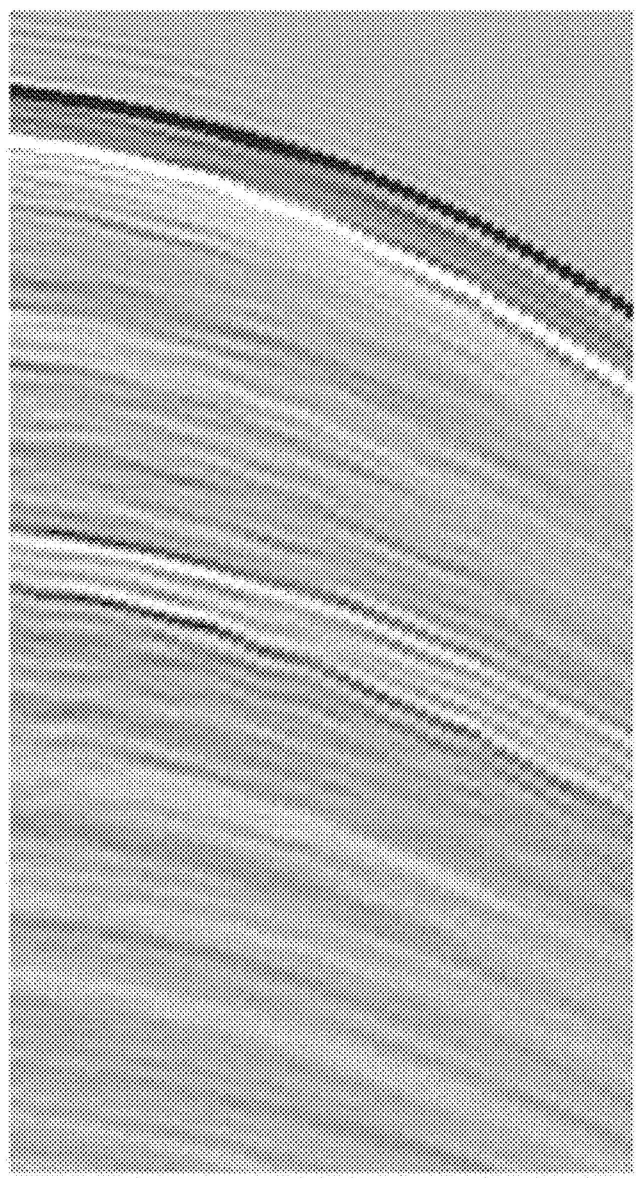
FIGS. 10(*a*)-10(*m*) illustrate various types of seismic data and processed seismic data, which can be used in embodiments.
Figure 10B:
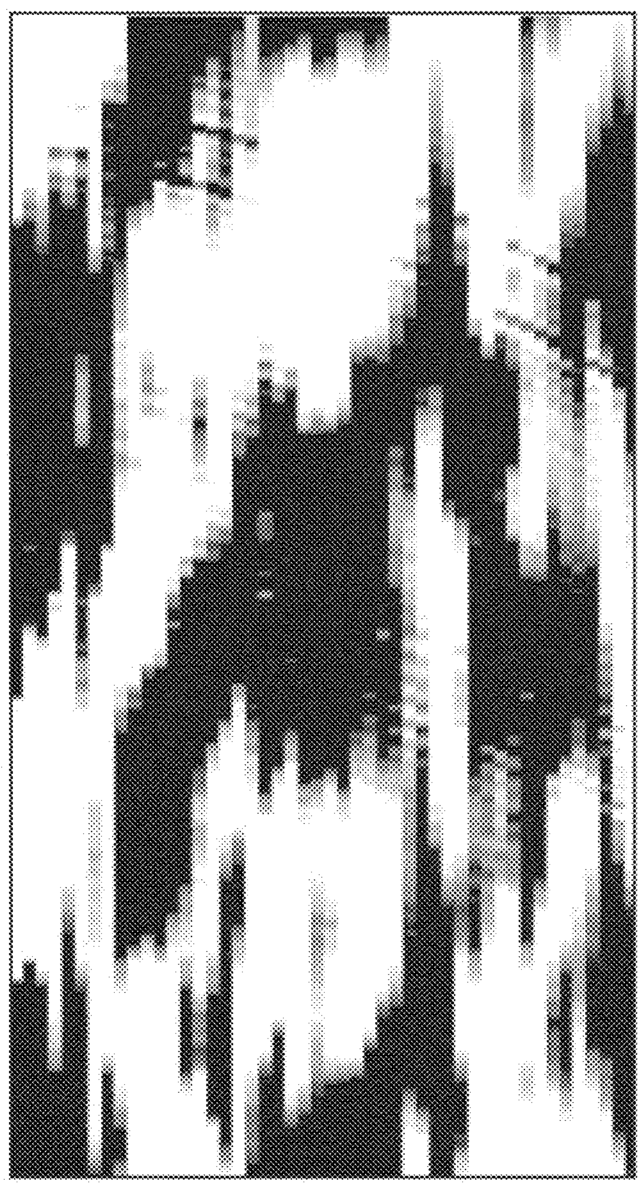
Figure 10C:
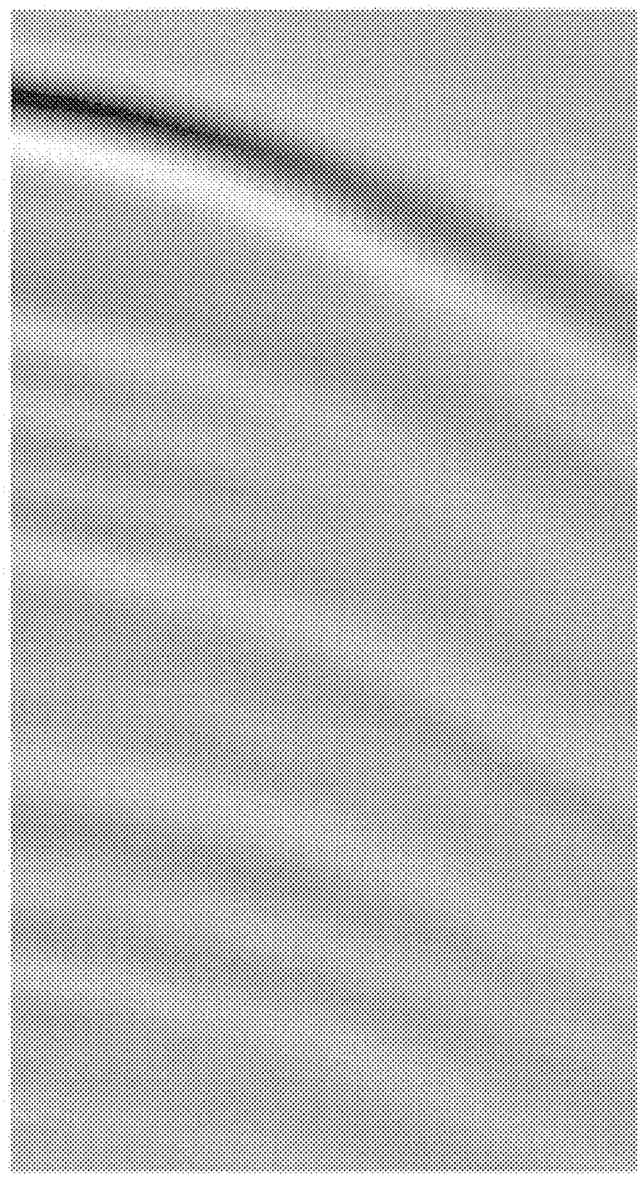
Figure 10D:
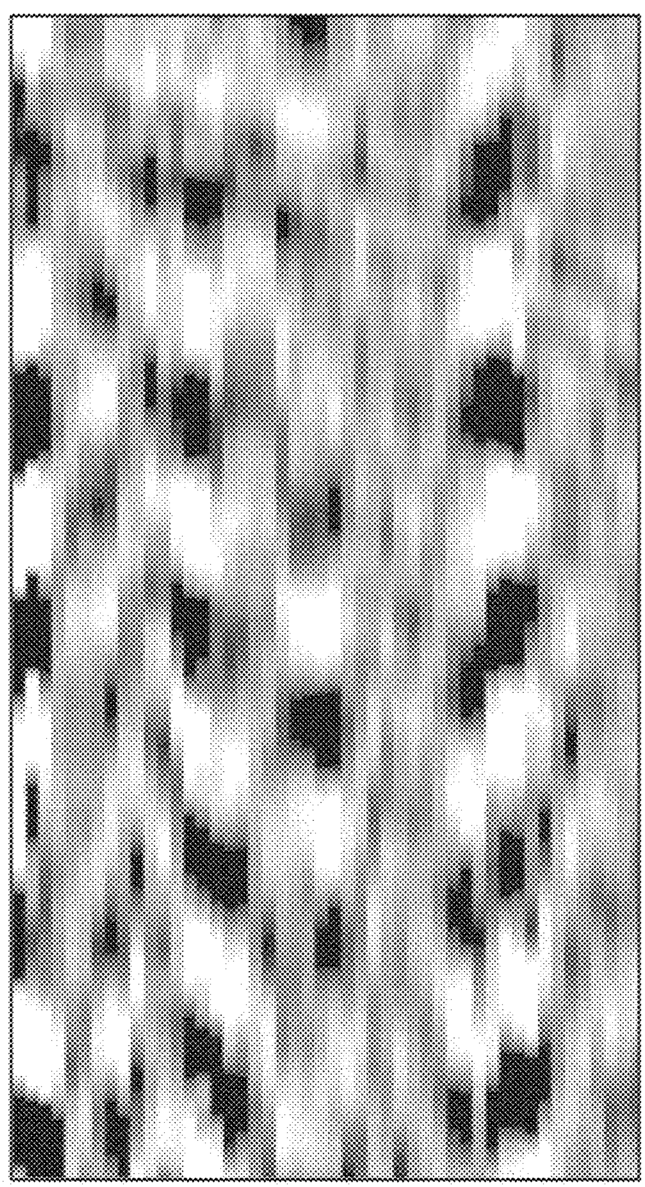
Figure 10G:
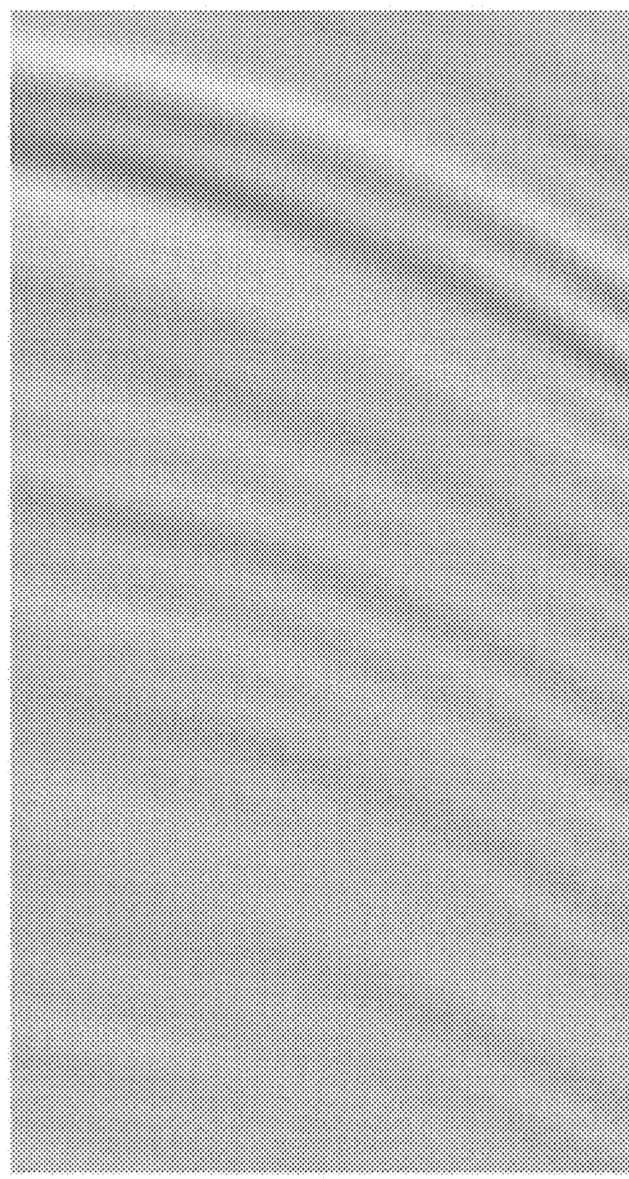
Figure 10H:
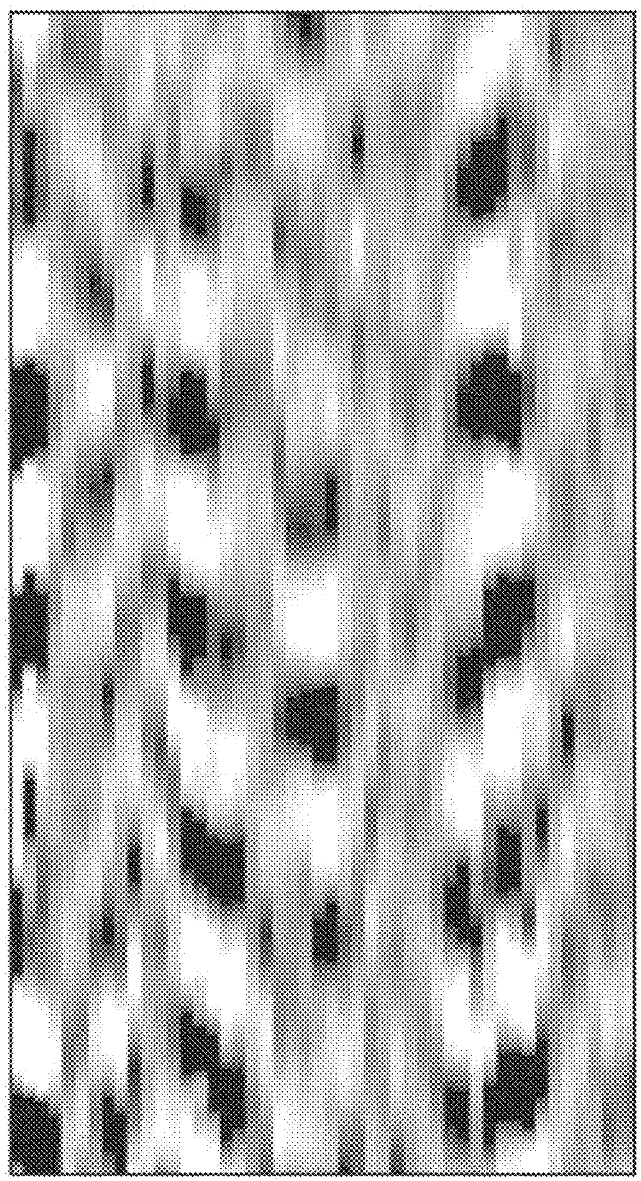
Figure 10I:
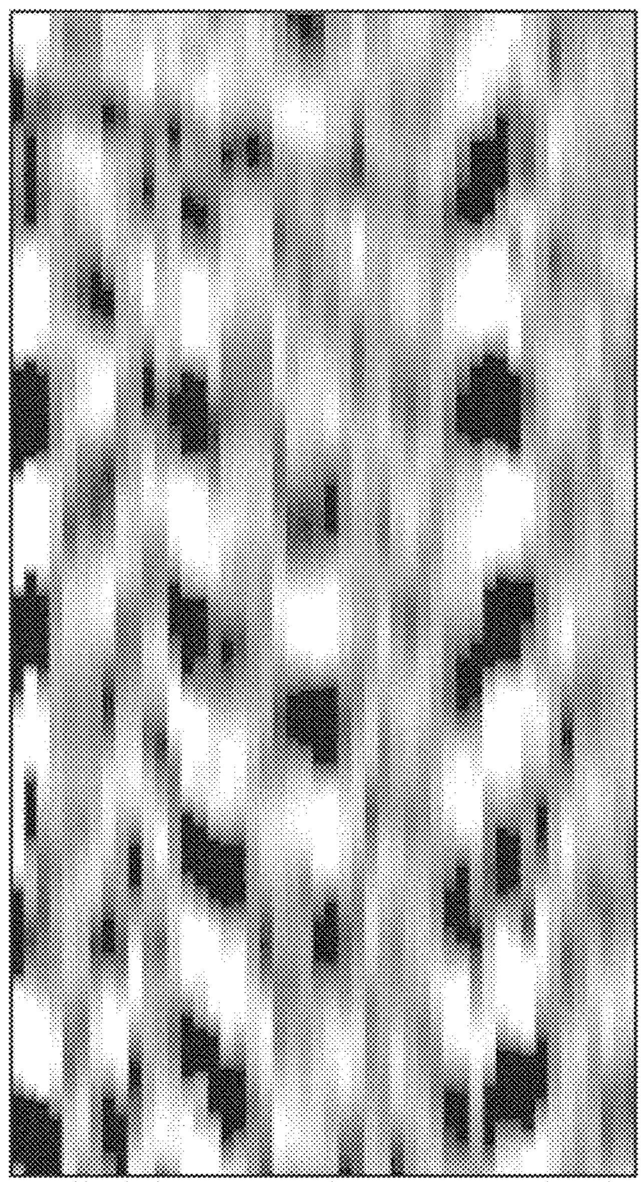
Figure 10J:
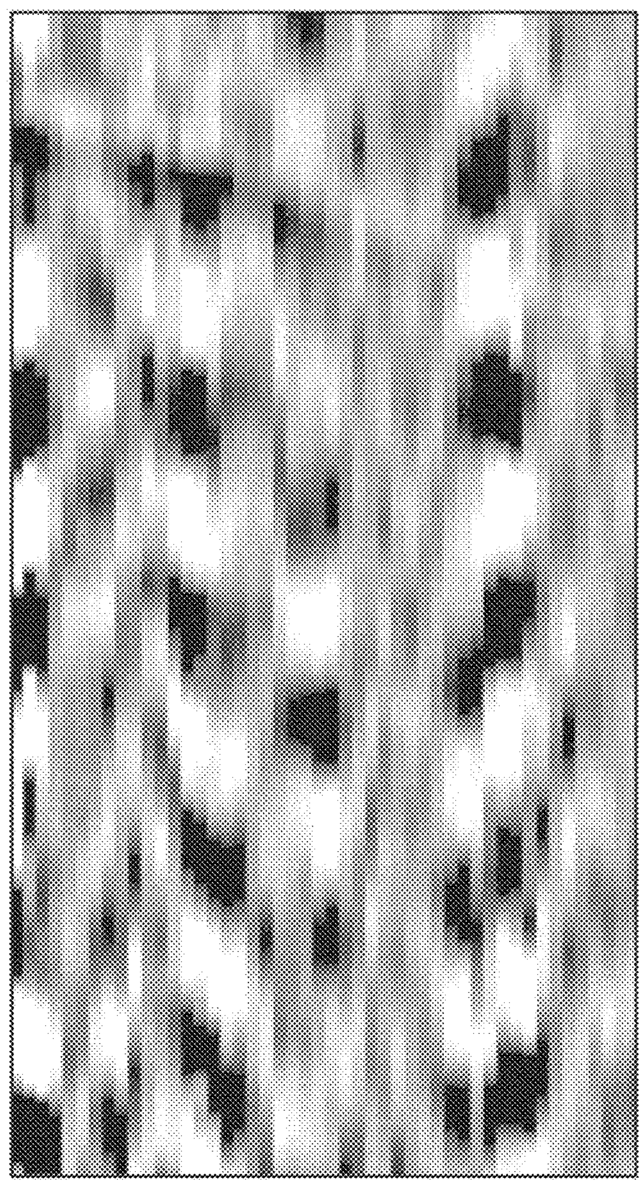
Figure 10K:
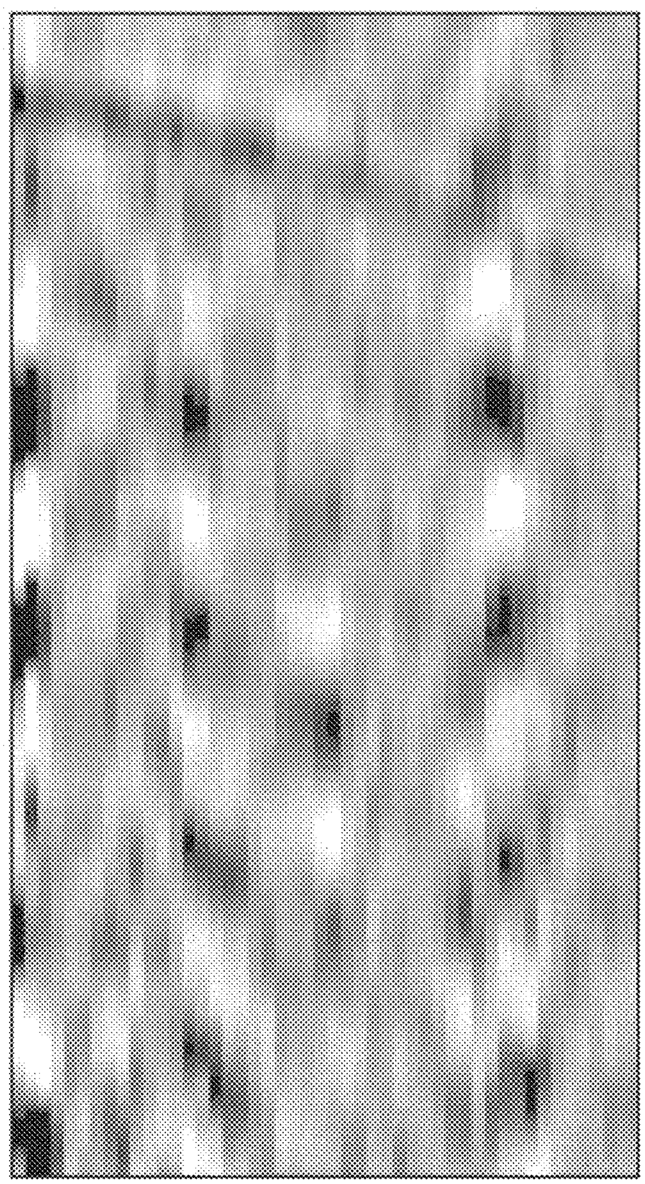
Figure 10L:
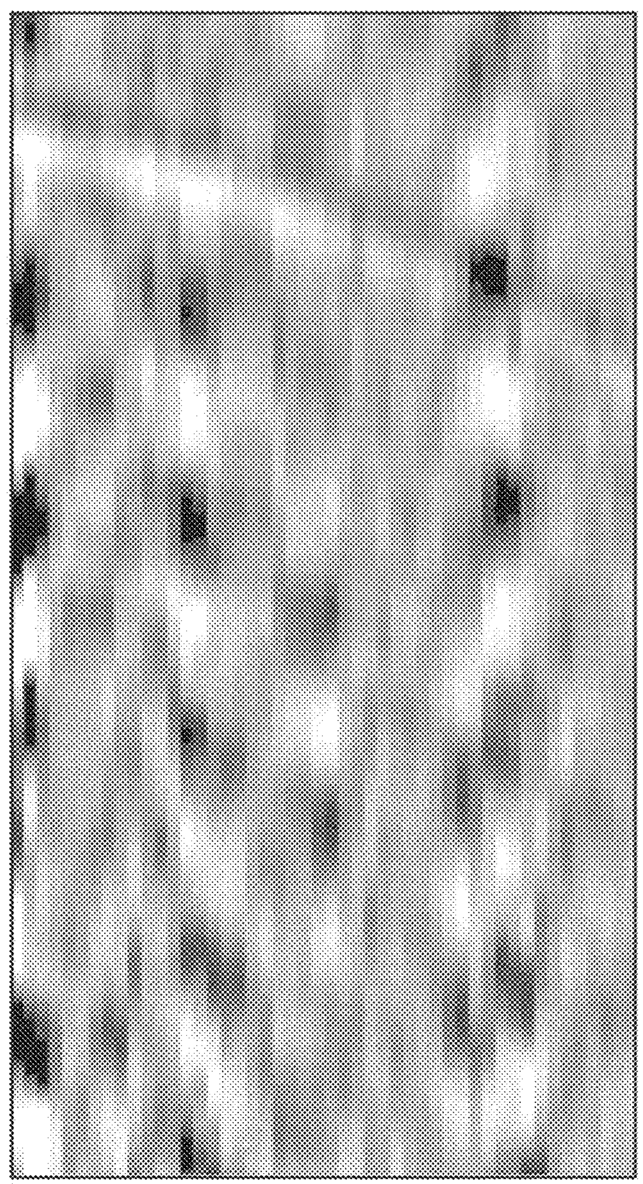
Figure 10M:
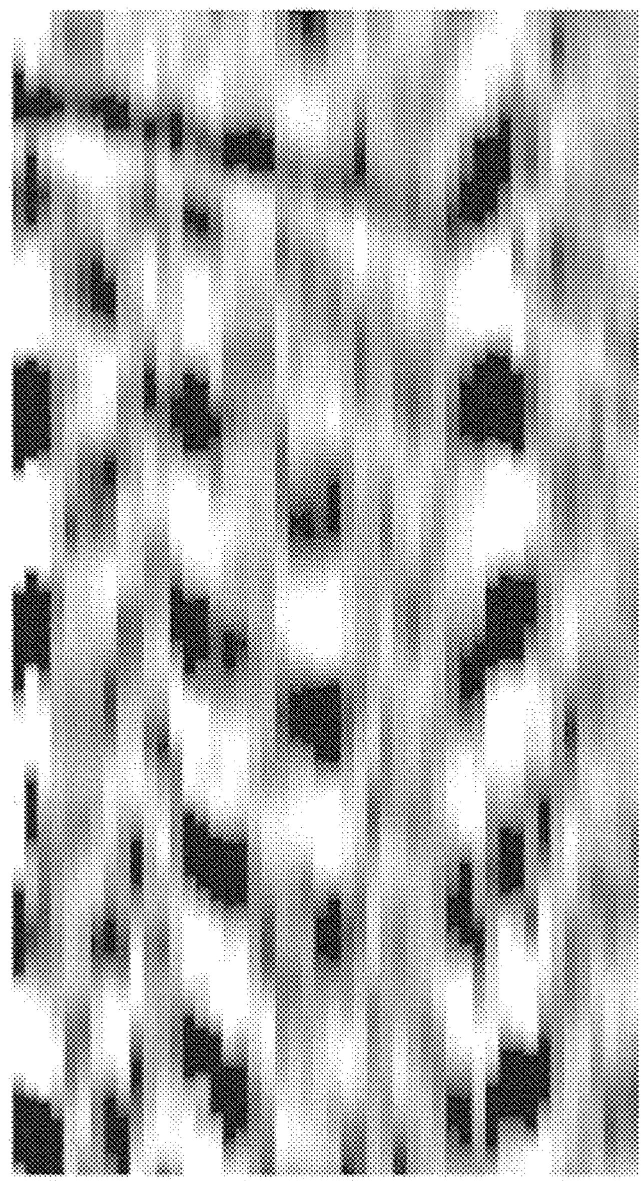

The computing device(s) or system involved in performing the various de-noising techniques as set forth in the above described embodiments may be any type of computing device capable of processing and communicating seismic data associated with a seismic survey. An example of a representative computing system capable of carrying out operations in accordance with these embodiments is very generally illustrated in FIG. 9. System 900 includes, among other items, one or more processors 902, a memory device 904, and an input/output (I/O) unit 906, all of which are interconnected by bus 908.

From the foregoing, it will be appreciated that embodiments derive an operator from high SN ratio seismic data and use the operator to denoise low SN ratio seismic data. The low SN ratio and high SN ratio data can come from the same receiver component, or same type of receiver component, or may come from different receiver components or types of receiver components. The high SN ratio data can be processed to make it more comparable with the low SN ratio data, e.g., the processing can involve processing hydrophone data to look like particle velocity data. The processing can involve wavefield separation based on hydrophone data and simulating vertical particle velocity data by changing the polarity of the ghost.

The operator can be masking in a model domain, where the model domain is FK, tau-p, parabolic Radon, hydperbolic Radon, curvelet, contourlet, ridgelet, SVD, rank reduction, Walsch series, wavelet transform, etc. The mask function can be an extrapolation of the energy distribution at high frequencies to an energy distribution at low frequencies. The mask function can be derived based on a comparison between the low SN ratio and high SN ratio datasets. The comparison can be based on a threshold of phase difference or based on a threshold of amplitude difference.

The operator can relate to a kinematic smoothing operator, e.g., based on local event dip, CRS, or other parameters. The operator can be a convolutional filter, e.g., a convolutional filter in the time domain or in the frequency domain. The frequency domain convolutional filter can be derived at a first frequency and applied to a second frequency or it can be derived at a first frequency and applied to the same (first) frequency.

In another embodiment, it is possible instead of using a clean dataset to derive a filter to denoise the noisy dataset, to apply a smoothing method. For example, the smoothing method may include a first step of receiving noisy data, e.g., Vz data, a second step of receiving clean data that is consistent with noisy data (e.g., Vz data simulated from hydrophones), a third step of interleave the two datasets, and a fourth step of smoothing through the datasets. Based on this method, an algorithm for deghosting to improve denoising of marine multicomponent seismic data may include the following processing steps:

Deghost the data.
Arrange P and Z traces alternately.
Denoise the data: use P as a guide to denoise Z or Z as a guide to denoise P.
Separate P and Z data back.
Re-ghost the data.

In some cases it would also beneficial to scale P or Z to make sure the two components have fairly similar amplitude before the data goes into denoising. Thus, the preceding algorithm can be modified as follows:

Deghost the data.
Arrange P and Z traces alternately.
Scale P or Z data.
Denoise the data: use P as a guide to denoise Z or Z as a guide to denoise P.
Scale P or Z data back.
Separate P and Z data back.
Re-ghost the data.

Another variant might be:

Deghost the data.
Scale P or Z data.
Arrange P and Z traces alternately.
Denoise the data: use P as a guide to denoise Z or Z as a guide to denoise P.
Separate P and Z data back.
Scale P or Z data back.
Re-ghost the data.

Any type of deghosting algorithm can be deployed as long as it is possible to back the effects of the deghosting off after denoising. It can be, for example, a so-called "inverse filter" that reverses the effects of the ghosts. The deghosting may be achieved in data-space or in tau-p space.

System 900 can be used to implement the methods described above associated with de-noising of seismic data. Hardware, firmware, software or a combination thereof may be used to perform the various steps and operations described herein.

It should be noted in the embodiments described herein that these techniques can be applied in either an "offline", e.g., at a land-based data processing center or an "online" manner, i.e., in near real time while onboard the seismic vessel. As also will be appreciated by one skilled in the art, the embodiments described herein may be embodied in a processor, a computing device or system, as a method or in a computer program product. Accordingly, the embodiments may take the form of an entirely hardware embodiment, a software embodiment or an embodiment combining hardware and software aspects. Further, the embodiments may take the form of a computer program product stored on a non-transitory computer-readable storage medium having computer-readable instructions embodied in the medium which, when executed, perform the steps described above. Any suitable computer readable medium may be utilized including hard disks, CD-ROMs, digital versatile discs (DVD), optical storage devices, or magnetic storage devices such a floppy disk or magnetic tape. Other non-limiting examples of computer readable media include flash-type memories or other known types of memories.

The disclosed embodiments provide an apparatus and a method for seismic data de-noising. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims. No element, act, or instruction used in the description of the present application should be construed as critical or essential to the invention unless explicitly described as such. Also, as used herein, the article "a" is intended to include one or more items.

What is claimed is:

1. A method for exploring structure of a subsurface of the earth, the method comprising:

receiving a first seismic data acquired from the subsurface;

receiving a second seismic data acquired from the subsurface;

processing with a processor the first seismic data having a first signal-to-noise ratio (SNR) to derive a denoising operator;

applying the de-noising operator to the second seismic data having a second SNR to remove noise from the second seismic data thereby obtaining denoised seismic data; and generating an image of the subsurface of the earth illustrating layers thereof based on the denoised seismic data to estimate location of a hydrocarbon reservoir in the subsurface, wherein the first SNR is greater than the second SNR, and wherein the first and second seismic data are recorded by seismic receivers detecting seismic excitations generated by a seismic source, after the seismic excitations travel through the subsurface of the earth.

2. The method of claim 1, wherein the first seismic data and the second seismic data come from a same receiver component.

3. The method of claim 1, wherein the first seismic data and the second seismic data come from different receiver components.

4. The method of claim 3, wherein the first seismic data comes from a hydrophone and the second seismic data comes from a particle motion component.

5. The method of claim 4, wherein the particle motion component is a geophone, particle velocity, or particle acceleration component.

6. The method of claim 1, wherein at least one of the first seismic data and the second seismic data is processed to have similar characteristics to the other at least one of the second seismic data and first seismic data, respectively.

7. The method of claim 1, wherein at least one of the first seismic data and the second seismic data is a combination of data from more than one receiver component.

8. The method of claim 1, wherein the first seismic data is associated with a first frequency bandwidth and the second seismic data is associated with a second frequency bandwidth.

9. The method of claim 8, wherein the first frequency bandwidth is higher frequency than the second frequency bandwidth.

10. The method of claim 9, wherein the first frequency bandwidth includes only one or more frequencies of 30 Hz or greater and the second frequency bandwidth includes only one or more frequencies of less than 30 Hz.

11. The method of claim 1, wherein the step of processing further comprises:

deriving a filter from the first portion of the seismic data as the de-noising operator.

12. The method of claim 11, wherein the step of processing further comprises:

deriving a prediction filter, as the de-noising operator, based on the first seismic data; and wherein the step of applying further comprises:

applying the prediction filter to the second seismic data.

13. The method of claim 12, wherein the step of deriving a prediction filter comprises deriving a prediction filter at a first frequency, and the step of applying the prediction filter comprises applying the prediction filter at a second frequency.

14. The method of claim 1, wherein the step of processing further comprises:

deriving a model from the first seismic data as the de-noising operator.

15. The method of claim 14, wherein the model is one of an FK domain, curvelet domain, SVD domain, rank reduction domain, Radon domain, tau-p domain, parabolic domain, hyperbolic domain, contourlet domain or ridgelet domain.

16. The method of claim 15, wherein a comparison between the first seismic data and the second seismic data is made to derive a masking function to separate signal and noise.

17. The method of claim 14, wherein the model is a Radon transform model and the step of processing further comprises:

deriving the Radon model based on sparseness weights from a previous iteration;

calculating sparseness weights for a current iteration; and repeating the deriving and calculating steps using lower frequency values to de-noise the seismic data in a manner which is constrained by higher frequency values.

18. The method of claim 1, wherein data from the high SNR ratio data is used to replace noisy data in the low SNR ratio data.

19. The method of claim 1, wherein the step of processing further comprises:

deriving one or more common reflection surface (CRS) operators from the first seismic data as the de-noising operator.

20. The method of claim 19, wherein the step of applying further comprises:

applying the one or more CRS operators to perform CRS processing of the second seismic data.

21. The method of claim 1, wherein the first SNR is greater than 1.

22. The method of claim 1, wherein the first seismic data is deghosted hydrophone data, and the second seismic data is deghosted particle velocity data.

23. The method of claim 1, wherein the first seismic data is synthesized particle velocity data generated from hydrophone data, and the second seismic data is recorded particle velocity data.

24. The method of claim 1, wherein the first seismic data is recorded hydrophone data and the second seismic data is combined hydrophone and particle velocity data.

25. A system for seismic exploration of structure of a subsurface of the earth, the system comprising:

an interface configured to receive a first seismic data and a second seismic data acquired from the subsurface; and at least one processor connected to the interface and configured to process the first seismic data having a first signal-to-noise ratio (SNR) to derive a denoising operator, and also configured to apply the de-noising operator to the second seismic data having a second SNR to remove noise from the second seismic data thereby obtaining denoised seismic data, and also configured to generate an image of the subsurface illustrating layers thereof based on the denoised seismic data, to estimate location of a hydrocarbon reservoir in the subsurface, wherein the first SNR is greater than the second SNR, wherein the first and second seismic data are recorded by seismic receivers detecting seismic excitations generated by a seismic source, after the seismic excitations travel through the subsurface.

* * * * *